(12) United States Patent
Chai

(10) Patent No.: US 11,508,439 B2
(45) Date of Patent: Nov. 22, 2022

(54) MEMORY DEVICE HAVING A CONTROL LOGIC TO CONTROL PROGRAM OPERATIONS AND METHOD OF OPERATING THE SAME

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/989,169

(22) Filed: Aug. 10, 2020

(65) Prior Publication Data

US 2021/0295918 A1 Sep. 23, 2021

(30) Foreign Application Priority Data

Mar. 17, 2020 (KR) .................. 10-2020-0032787

(51) Int. Cl.
*G11C 16/10* (2006.01)
*G11C 16/34* (2006.01)
*G11C 11/56* (2006.01)
*G11C 16/04* (2006.01)

(52) U.S. Cl.
CPC .......... *G11C 16/10* (2013.01); *G11C 16/3459* (2013.01); *G11C 11/5628* (2013.01); *G11C 16/0483* (2013.01)

(58) Field of Classification Search
CPC . G11C 16/10; G11C 16/3459; G11C 16/0483; G11C 11/5628
See application file for complete search history.

(56) References Cited

U.S. PATENT DOCUMENTS

| 8,107,287 | B2 * | 1/2012 | Jung | .............. | G11C 16/0483 |
| | | | | | 365/185.03 |
| 8,619,474 | B2 * | 12/2013 | Goda | .............. | G11C 16/0483 |
| | | | | | 365/195 |
| 2007/0002629 | A1 * | 1/2007 | Lee | .............. | G11C 8/08 |
| | | | | | 365/185.19 |
| 2007/0133278 | A1 * | 6/2007 | Matsubara | .............. | G11C 16/3468 |
| | | | | | 365/185.3 |
| 2012/0170364 | A1 * | 7/2012 | Jang | .............. | G11C 16/3459 |
| | | | | | 365/185.03 |
| 2012/0170366 | A1 * | 7/2012 | Kim | .............. | G11C 16/16 |
| | | | | | 365/185.03 |
| 2013/0214415 | A1 * | 8/2013 | Pachamuthu | .............. | H01L 27/11524 |
| | | | | | 257/751 |

(Continued)

FOREIGN PATENT DOCUMENTS

KR 10-2017-0059643 5/2017

*Primary Examiner* — Alfredo Bermudez Lozada
(74) *Attorney, Agent, or Firm* — IP & T Group LLP

(57) ABSTRACT

Provided herein may be a memory device and a method of operating the same. The memory device may include a memory cell array including a plurality of memory cells, a peripheral circuit configured to program the plurality of memory cells to a plurality of program states, and a control logic configured to control the peripheral circuit so that program operations corresponding to the plurality of program states are performed, wherein the control logic controls the peripheral circuit so that, during a program operation for a target program state, among the plurality of program states, memory cells to be programmed to an immediately higher program state than the target program state are programmed to the target program state.

10 Claims, 17 Drawing Sheets

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV1) | PGM MODE (PV target=PV2) | PGM MODE (PV target=PV2) | PGM MODE (PV target=PV2) | PGM MODE (PV target=PV2) | PGM MODE (PV target=PV2) |
| PV2 IN PROGRESS (PV1 COMPLETED) | INHIBIT MODE (PGM COMPLETED) | PGM MODE (PV target=PV2) | PGM MODE (PV target=PV2) | PGM MODE (PV target=PV3) | PGM MODE (PV target=PV3) | PGM MODE (PV target=PV3) | PGM MODE (PV target=PV3) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV3) | PGM MODE (PV target=PV4) | PGM MODE (PV target=PV4) | PGM MODE (PV target=PV4) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV4) | PGM MODE (PV target=PV5) | PGM MODE (PV target=PV5) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV5) | PGM MODE (PV target=PV6) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV6) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

(56) References Cited

U.S. PATENT DOCUMENTS

2018/0068733 A1\* 3/2018 Lee .................... G11C 16/3418
2019/0332436 A1\* 10/2019 Lee ...................... G06F 3/0679
2020/0075102 A1\* 3/2020 Liu .................... G11C 16/3459

\* cited by examiner

FIG. 9

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV1) | PGM MODE (PV target=PV2) | PGM MODE (PV target=PV2) | PGM MODE (PV target=PV2) | PGM MODE (PV target=PV2) | PGM MODE (PV target=PV2) |
| PV2 IN PROGRESS (PV1 COMPLETED) | INHIBIT MODE (PGM COMPLETED) | PGM MODE (PV target=PV2) | PGM MODE (PV target=PV2) | PGM MODE (PV target=PV3) | PGM MODE (PV target=PV3) | PGM MODE (PV target=PV3) | PGM MODE (PV target=PV3) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV3) | PGM MODE (PV target=PV4) | PGM MODE (PV target=PV4) | PGM MODE (PV target=PV4) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV4) | PGM MODE (PV target=PV5) | PGM MODE (PV target=PV5) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV5) | PGM MODE (PV target=PV5) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV6) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

FIG. 10

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV2) | PGM MODE (PV target=PV3) | PGM MODE (PV target=PV4) | PGM MODE (PV target=PV5) | PGM MODE (PV target=PV6) | PGM MODE (PV target=PV7) |
| PV2 IN PROGRESS (PV1 COMPLETED) | INHIBIT MODE (PGM COMPLETED) | PGM MODE (PV target=PV2) | PGM MODE (PV target=PV3) | PGM MODE (PV target=PV4) | PGM MODE (PV target=PV5) | PGM MODE (PV target=PV6) | PGM MODE (PV target=PV7) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV4) | PGM MODE (PV target=PV5) | PGM MODE (PV target=PV6) | PGM MODE (PV target=PV7) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV5) | PGM MODE (PV target=PV6) | PGM MODE (PV target=PV7) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV6) | PGM MODE (PV target=PV7) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV7) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

FIG. 11

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV1) | PGM MODE (PV target=PV1) | PGM MODE (PV target=PV2) | PGM MODE (PV target=PV2) | PGM MODE (PV target=PV2) | PGM MODE (PV target=PV2) |
| PV2 IN PROGRESS (PV1 COMPLETED) | INHIBIT MODE (PGM COMPLETED) | PGM MODE (PV target=PV2) | PGM MODE (PV target=PV2) | PGM MODE (PV target=PV2) | PGM MODE (PV target=PV2) | PGM MODE (PV target=PV3) | PGM MODE (PV target=PV3) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV3) | PGM MODE (PV target=PV3) | PGM MODE (PV target=PV3) | PGM MODE (PV target=PV4) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV4) | PGM MODE (PV target=PV4) | PGM MODE (PV target=PV4) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV5) | PGM MODE (PV target=PV5) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV6) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

FIG. 12

|  | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV2) | PGM MODE (PV target=PV2) | PGM MODE (PV target=PV3) | PGM MODE (PV target=PV3) | PGM MODE (PV target=PV3) | PGM MODE (PV target=PV3) |
| PV2 IN PROGRESS (PV1 COMPLETED) | INHIBIT MODE (PGM COMPLETED) | PGM MODE (PV target=PV2) | PGM MODE (PV target=PV3) | PGM MODE (PV target=PV3) | PGM MODE (PV target=PV4) | PGM MODE (PV target=PV4) | PGM MODE (PV target=PV4) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV4) | PGM MODE (PV target=PV4) | PGM MODE (PV target=PV5) | PGM MODE (PV target=PV5) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV5) | PGM MODE (PV target=PV5) | PGM MODE (PV target=PV5) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV6) | PGM MODE (PV target=PV6) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV7) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

FIG. 13

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV1) | PGM MODE (PV target=PV2) | PGM MODE (PV target=PV2) | PGM MODE (PV target=PV3) | PGM MODE (PV target=PV3) | PGM MODE (PV target=PV3) |
| PV2 IN PROGRESS (PV1 COMPLETED) | INHIBIT MODE (PGM COMPLETED) | PGM MODE (PV target=PV2) | PGM MODE (PV target=PV2) | PGM MODE (PV target=PV3) | PGM MODE (PV target=PV3) | PGM MODE (PV target=PV4) | PGM MODE (PV target=PV4) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV3) | PGM MODE (PV target=PV4) | PGM MODE (PV target=PV4) | PGM MODE (PV target=PV4) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV4) | PGM MODE (PV target=PV5) | PGM MODE (PV target=PV5) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV5) | PGM MODE (PV target=PV5) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV6) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

FIG. 14

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV1) | PGM MODE (No Inhibit) | PGM MODE (No Inhibit) | PGM MODE (No Inhibit) | PGM MODE (No Inhibit) | PGM MODE (No Inhibit) |
| PV2 IN PROGRESS (PV1 COMPLETED) | INHIBIT MODE (PGM COMPLETED) | PGM MODE (PV target=PV2) | PGM MODE (PV target=PV2) | PGM MODE (No Inhibit) | PGM MODE (No Inhibit) | PGM MODE (No Inhibit) | PGM MODE (No Inhibit) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV3) | PGM MODE (No Inhibit) | PGM MODE (No Inhibit) | PGM MODE (No Inhibit) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV4) | PGM MODE (No Inhibit) | PGM MODE (No Inhibit) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV5) | PGM MODE (No Inhibit) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV6) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

FIG. 15

| | PMCs to PV1 | PMCs to PV2 | PMCs to PV3 | PMCs to PV4 | PMCs to PV5 | PMCs to PV6 | PMCs to PV7 |
|---|---|---|---|---|---|---|---|
| PV1 IN PROGRESS | PGM MODE (PV target=PV1) | PGM MODE (PV target=PV2) | PGM MODE (NO Inhibit) | PGM MODE (NO Inhibit) | PGM MODE (NO Inhibit) | PGM MODE (NO Inhibit) | PGM MODE (NO Inhibit) |
| PV2 IN PROGRESS (PV1 COMPLETED) | INHIBIT MODE (PGM COMPLETED) | PGM MODE (PV target=PV2) | PGM MODE (PV target=PV3) | PGM MODE (NO Inhibit) | PGM MODE (NO Inhibit) | PGM MODE (NO Inhibit) | PGM MODE (NO Inhibit) |
| PV3 IN PROGRESS (PV1,2 COMPLETED) | INHIBIT MODE (PGM COMPLETED) | INHIBIT MODE (PGM COMPLETED) | PGM MODE (PV target=PV3) | PGM MODE (PV target=PV4) | PGM MODE (NO Inhibit) | PGM MODE (NO Inhibit) | PGM MODE (NO Inhibit) |
| PV4 IN PROGRESS (PV1,2,3 COMPLETED) | INHIBIT MODE (PGM COMPLETED) | INHIBIT MODE (PGM COMPLETED) | INHIBIT MODE (PGM COMPLETED) | PGM MODE (PV target=PV4) | PGM MODE (PV target=PV5) | PGM MODE (NO Inhibit) | PGM MODE (NO Inhibit) |
| PV5 IN PROGRESS (PV1,2,3,4 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV5) | PGM MODE (PV target=PV6) | PGM MODE (NO Inhibit) |
| PV6 IN PROGRESS (PV1,2,3,4,5 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV6) | PGM MODE (PV target=PV7) |
| PV7 IN PROGRESS (PV1,2,3,4,5,6 COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | INHIBIT MODE (PGM COMPLETED) | PGM MODE (PV target=PV7) |

MEMORY DEVICE HAVING A CONTROL LOGIC TO CONTROL PROGRAM OPERATIONS AND METHOD OF OPERATING THE SAME

CROSS-REFERENCE TO RELATED APPLICATION

The present application claims priority under 35 U.S.C. § 119(a) to Korean patent application number 10-2020-0032787, filed on Mar. 17, 2020, which is incorporated herein by reference in its entirety.

BACKGROUND

Field of Invention

Various embodiments of the present disclosure relate to an electronic device, and more particularly, to a memory device and a method of operating the memory device.

Description of Related Art

Recently, the paradigm for a computer environment has been transitioning to ubiquitous computing, which enables computer systems to be used anytime and anywhere. As a result, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device for portable electronic devices.

Since there is no mechanical driving part, a data storage device using a memory device provides advantages such as improved stability and durability, high information access speed, and low power consumption. Data storage devices, as an example of the memory system having such advantages, include a universal serial bus (USB) memory device, memory cards having various interfaces, and a solid state drive (SSD).

Memory devices may be classified into a volatile memory device and a nonvolatile memory device.

A nonvolatile memory device has comparatively low write and read speed, but retains data stored therein even when the supply of power is interrupted. Therefore, the nonvolatile memory device is used to store data to be retained regardless of whether power is supplied. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

SUMMARY

Various embodiments of the present disclosure are directed to a memory device, which can improve the range of threshold voltage distributions of memory cells during a program operation of the memory device, and a method of operating the memory device.

An embodiment of the present disclosure may provide for a memory device. The memory device may include a memory cell array including a plurality of memory cells, a peripheral circuit configured to program the plurality of memory cells to a plurality of program states, and a control logic configured to control the peripheral circuit so that program operations corresponding to the plurality of program states are performed, wherein the control logic controls the peripheral circuit so that, during a program operation for a target program state, among the plurality of program states, memory cells to be programmed to an immediately higher program state than the target program state are programmed to the target program state.

An embodiment of the present disclosure may provide for a memory device. The memory device may include a memory cell array including a plurality of memory cells, a peripheral circuit configured to program the plurality of memory cells to a plurality of program states, and a control logic configured to control the peripheral circuit so that program operations corresponding to the plurality of program states are performed, wherein the control logic controls the peripheral circuit so that, during a program operation for a target program state among the plurality of program states, memory cells to be programmed to higher program states than the target program state, are programmed to a pre-program state.

An embodiment of the present disclosure may provide for a method of operating a memory device. The method may include programming first memory cells to be programmed to a target program state, among a plurality of memory cells, and programming second memory cells to be programmed to an immediately higher program state than the target program state, among the plurality of memory cells, to the target program state.

BRIEF DESCRIPTION OF THE DRAWINGS

FIG. 9 is a diagram for describing program modes of memory cells depending on respective program states during a program operation according to an embodiment of the present disclosure.

FIG. 10 is a diagram for describing program modes of memory cells depending on respective program states during a program operation according to an embodiment of the present disclosure.

FIG. 11 is a diagram for describing program modes of memory cells depending on respective program states during a program operation according to an embodiment of the present disclosure.

FIG. 12 is a diagram for describing program modes of memory cells depending on respective program states during a program operation according to an embodiment of the present disclosure.

FIG. 13 is a diagram for describing program modes of memory cells depending on respective program states during a program operation according to an embodiment of the present disclosure.

FIG. 14 is a diagram for describing program modes of memory cells depending on respective program states during a program operation according to an embodiment of the present disclosure.

FIG. 15 is a diagram for describing program modes of memory cells depending on respective program states during a program operation according to an embodiment of the present disclosure.

DETAILED DESCRIPTION

Specific structural or functional descriptions in the embodiments of the present disclosure introduced in this specification or application are mere examples to describe embodiments of the present disclosure. Various embodiments of the present disclosure may be practiced in various forms, and should not be construed as being limited to the embodiments described in the specification or application.

Various embodiments of the present disclosure will now be described more fully hereinafter with reference to the accompanying drawings, so that those skilled in the art can easily practice the technical spirit of the present disclosure.

Figure 1:
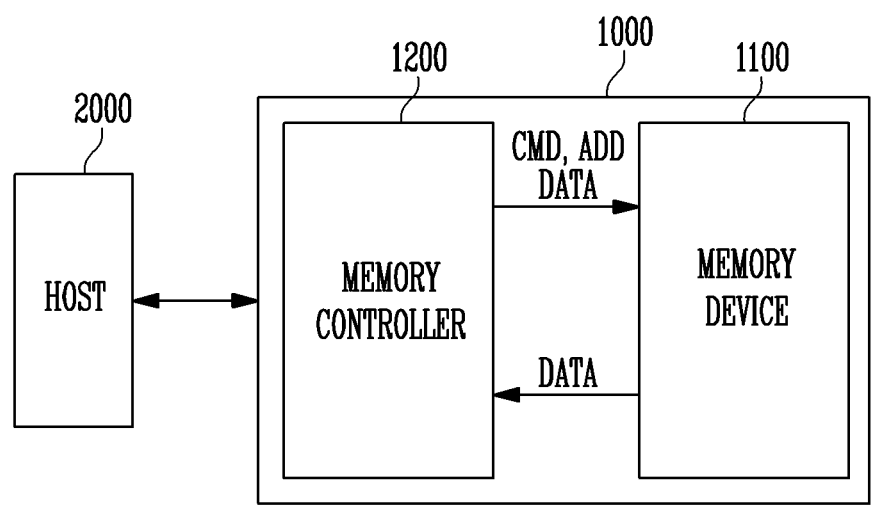
FIG. 1 is a diagram illustrating a memory system according to an embodiment of the present disclosure.

FIG. 1 is a diagram illustrating a memory system according to an embodiment.

Referring to FIG. 1, a memory system 1000 may include a memory device 1100 which stores data, and a memory controller 1200 which controls the memory device 1100 under the control of a host 2000.

The host 2000 is capable of communicating with the memory system 1000 using an interface protocol, such as Peripheral Component Interconnect-Express (PCI-E), Advanced Technology Attachment (ATA), Serial ATA (SATA), Parallel ATA (PATA) or Serial Attached SCSI (SAS). In addition, the interface protocol between the host 2000 and the memory system 1000 is not limited to the above-described examples, and may be one of various interface protocols, such as Universal Serial Bus (USB), Multi-Media Card (MMC), Enhanced Small Disk Interface (ESDI), and Integrated Drive Electronics (IDE).

The memory controller 1200 may control the overall operation of the memory system 1000, and may control data exchange between the host 2000 and the memory device 1100. For example, the memory controller 1200 may program or read data by controlling the memory device 1100 in response to a request received from the host 2000. During a program operation, the memory controller 1200 may transmit a command CMD corresponding to the program operation, an address ADD, and data to be programmed DATA to the memory device 1100. Further, during a read operation, the memory controller 1200 may receive data DATA read from the memory device 1100, may temporarily store the data DATA, and may transmit the temporarily stored data DATA to the host 2000.

The memory device 1100 may perform a program operation, a read operation, or an erase operation under the control of the memory controller 1200.

In an embodiment, the memory device 1100 may include a double data rate synchronous dynamic random access memory (DDR SDRAM), low power double data rate fourth generation (LPDDR4) SDRAM, a graphics double data rate (GDDR) SDRAM, a low power DDR (LPDDR) SDRAM, a Rambus DRAM (RDRAM) or a flash memory.

During a program operation, the memory device 1100 according to an embodiment of the present disclosure may sequentially perform program operations corresponding to a plurality of program states. During a program operation for a target program state, the memory device 1100 may program memory cells, which are to be programmed to an immediately higher program state than the target program state, to the target program state, and may program memory cells, which are to be programmed to further higher program states to a pre-program state or a pre-state. The pre-program state may be a program state adjacent to and higher than the target program state.

Figure 2:
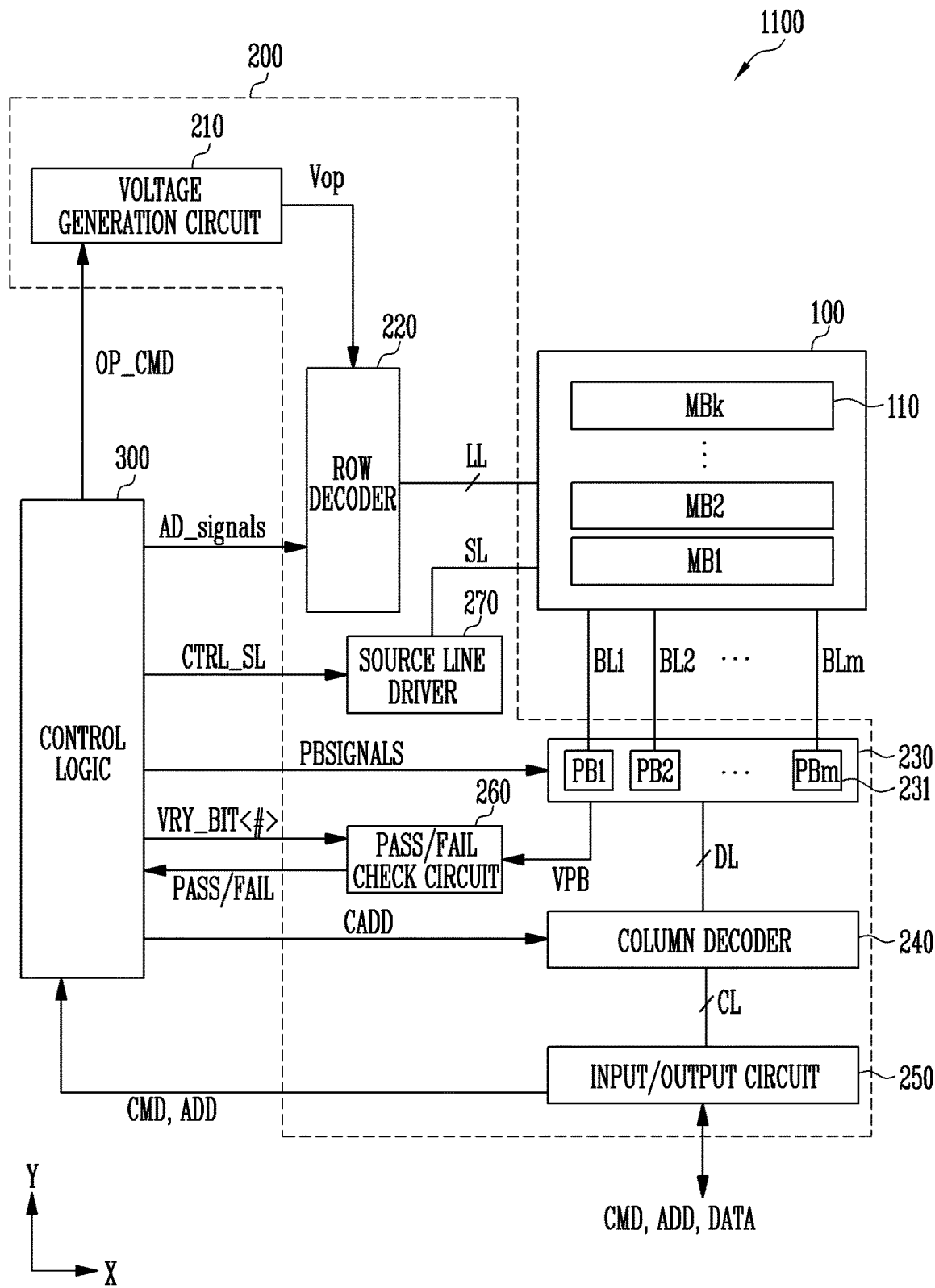
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include a control logic 300 which controls the peripheral circuits 200 under the control of a memory controller (e.g., 1200 of FIG. 1).

The memory cell array 100 may include a plurality of memory blocks MB1 to MBk 110 (where k is a positive integer). Local lines LL and bit lines BL1 to BLm (where m is a positive integer) may be coupled to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include dummy lines. For example, the local lines LL may further include pipelines. The local lines LL may be coupled to each of the memory blocks MB1 to MBk 110, and the bit lines BL1 to BLm may be coupled in common to the memory blocks MB1 to MBk 110. The memory blocks MB1 to MBk 110 may each be implemented in a two-dimensional (2D) or three-dimensional (3D) structure. For example, memory cells in the memory blocks 110 having a 2D structure may be horizontally arranged on a substrate. For example, memory cells in the memory blocks 110 having a 3D structure may be vertically stacked on the substrate.

The peripheral circuits 200 may perform program, read, and erase operations on a selected memory block 110 under the control of the control logic 300. For example, the peripheral circuits 200 may include a voltage generation circuit 210, a row decoder 220, a page buffer group 230, a column decoder 240, an input/output circuit 250, a pass/fail check circuit 260, and a source line driver 270.

The voltage generation circuit 210 may generate various operating voltages Vop that are used for program, read, and erase operations in response to an operation signal OP_CMD. Further, the voltage generation circuit 210 may selectively discharge the local lines LL in response to the operation signal OP_CMD. For example, the voltage generation circuit 210 may generate various voltages such as a program voltage, a verify voltage, and a pass voltage under the control of the control logic 300.

The row decoder 220 may transfer the operating voltages Vop to the local lines LL coupled to the selected memory block 110 in response to row decoder control signals AD_signals. For example, during a program operation, the row decoder 220 may apply the program voltage, generated by the voltage generation circuit 210, to a selected word line, among the local lines LL, in response to the row decoder control signals AD_signals, and may apply the pass voltage, generated by the voltage generation circuit 210, to the remaining word lines, that is, unselected word lines.

The page buffer group 230 may include a plurality of page buffers PB1 to PBm 231 coupled to the bit lines BL1 to BLm. The page buffers PB1 to PBm 231 may be operated in response to the page buffer control signals PBSIGNALS. For example, during a program operation, the page buffers PB1 to PBm 231 may temporarily store data to be programmed, and may adjust the potential levels of the bit lines BL1 to BLm based on the temporarily stored data to be programmed. Furthermore, during a read or program verify operation, the page buffers PB1 to PBm 231 may sense the voltages or currents of the bit lines BL1 to BLm. The page buffers PB1 to PBm 231 may control the corresponding bit lines BL1 to BLm to a program mode or a program-inhibit mode during a program operation. Threshold voltages of the memory cells coupled to bit lines in the program mode increase due to the program voltage applied to the word line of the memory cells during a program operation, and threshold voltages of the memory cells coupled to bit lines in the program-inhibit mode do not increase even if the program voltage is applied to the word line of the memory cells during a program operation. For example, the page buffers PB1 to PBm 231 may control the potential levels of the bit lines BL1 to BLm to the level of a program permission voltage (e.g., a ground voltage) in a program mode, and may control the potential levels of the bit lines BL1 to BLm to a program inhibition voltage (e.g., a supply voltage) in a program-inhibit mode.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transmit a command CMD and an address ADD, received from the memory controller (e.g., 1200 of FIG. 1), to the control logic 300, or may exchange data DATA with the column decoder 240. The input/output circuit 250 may transmit bad block information BB_info, received from the control logic 300, to an external device (e.g., the memory controller 1200 of FIG. 1).

During a read operation or a program verify operation, the pass/fail check circuit 260 may generate a reference current in response to an enable bit VRY_BIT<#>, and may compare a sensing voltage VPB, received from the page buffer group 230, with a reference voltage, generated by the reference current, and then output a pass signal PASS or a fail signal FAIL. The sensing voltage VPB may be a voltage that is controlled based on the number of memory cells determined to have passed the program verify operation.

The source line driver 270 may be coupled to memory cells included in the memory cell array 100 through the source line SL, and may control a voltage to be applied to the source line SL. The source line driver 270 may receive a source line control signal CTRL_SL from the control logic 300, and may control a source line voltage to be applied to the source line SL in response to the source line control signal CTRL_SL.

The control logic 300 may control the peripheral circuits 200 by outputting the operation signal OP_CMD, the row decoder control signals AD_signals, the page buffer control signals PBSIGNALS, and the enable bit VRY_BIT<#> in response to the command CMD and the address ADD. The control logic 300 may control the peripheral circuits 200 so that program operations corresponding to a plurality of program states are sequentially performed during a program operation. Also, the control logic 300 may control the peripheral circuits 200 so that, during a program operation for a target program state, memory cells, which are to be programmed to an immediately higher program state than the target program state, are programmed to the target program state. Further, the control logic 300 may control the peripheral circuits 200 so that, during the program operation for the target program state, memory cells to be programmed to the further higher program states than the immediately higher program state are programmed to a pre-program state.

Figure 3:
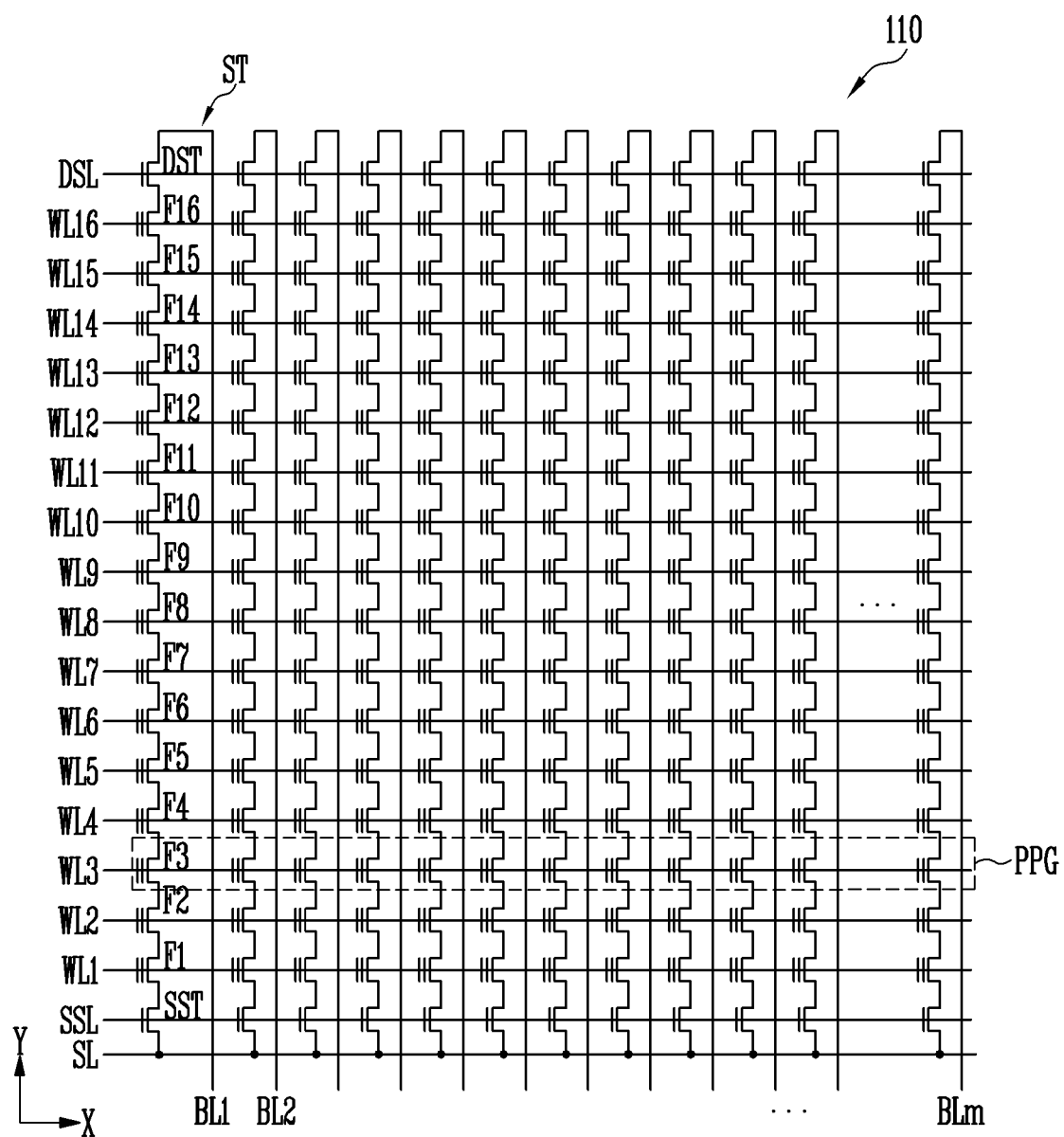
FIG. 3 is a diagram illustrating a memory block of FIG. 2.

FIG. 3 is a diagram illustrating the memory block of FIG. 2.

Referring to FIG. 3, a plurality of word lines arranged in parallel to each other between a first select line and a second select line may be coupled to the memory block 110. Here, the first select line may be a source select line SSL, and the second select line may be a drain select line DSL. In an embodiment, the memory block 110 may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a 'physical page (PPG)'. Therefore, the memory block 110 may include a number of physical pages PPG identical to the number of word lines WL1 to WL16.

Figure 4:
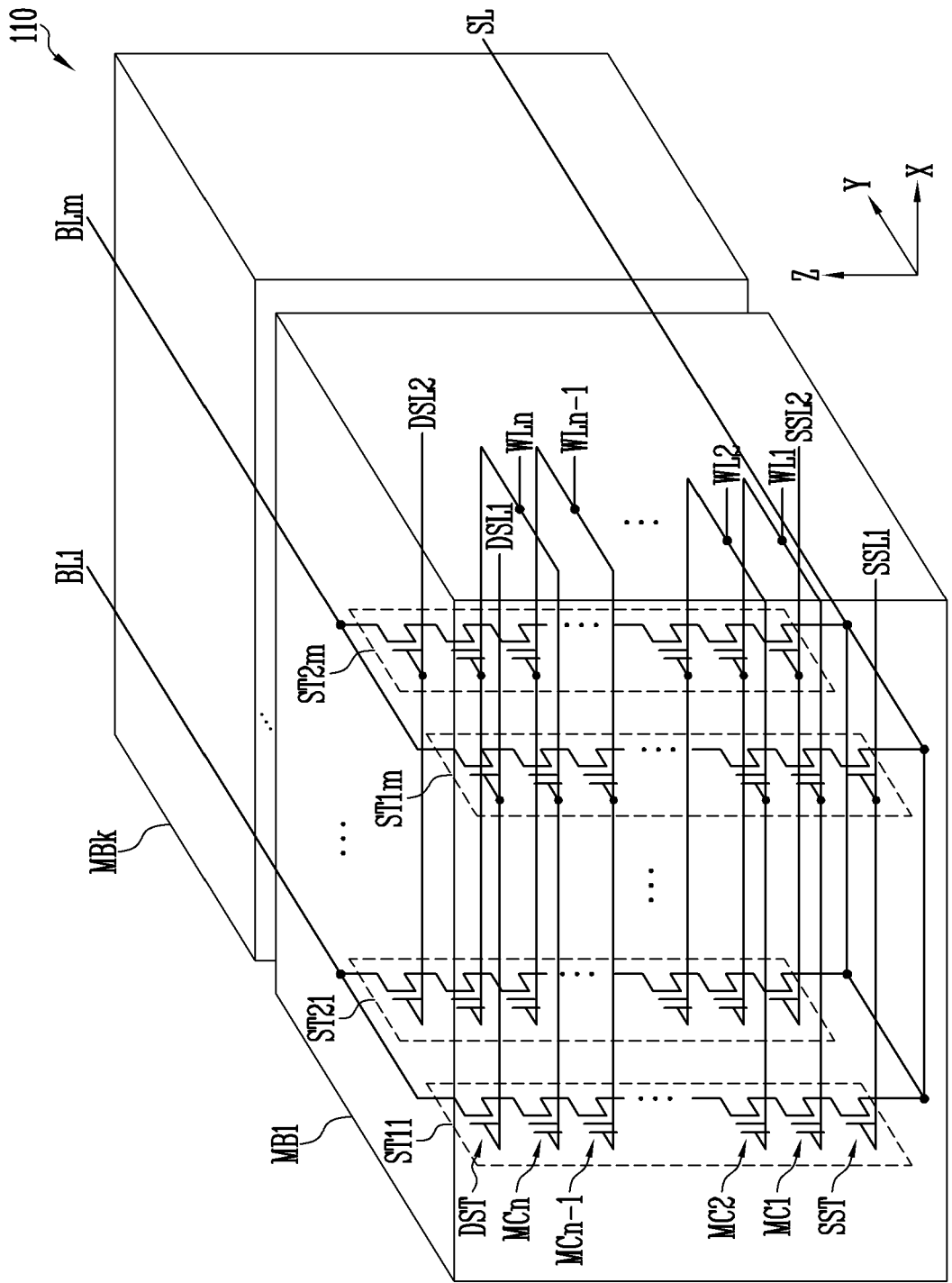
FIG. 4 is a diagram illustrating an example of a memory block having a 3D structure.

FIG. 4 is a diagram illustrating an example of a memory block having a 3D structure.

Referring to FIG. 4, the memory cell array 100 may include a plurality of memory blocks MB1 to MBk 110. Each memory block 110 may include a plurality of strings ST11 to ST1m and ST21 to ST2m. In an embodiment, each of the strings ST11 to ST1m and ST21 to ST2m may be formed in an 'I' shape or a 'U' shape. In the first memory block MB1, m strings may be arranged in a row direction (e.g., X direction). Although, in FIG. 4, two strings are illustrated as being arranged in a column direction (e.g., Y direction), this embodiment is given for convenience of description, and three or more strings may be arranged in the column direction (e.g., Y direction) in other embodiments.

Each of the strings ST11 to ST1m and ST21 to ST2m may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11 to ST1m arranged in a first row may be coupled to a first source select line SSL1. The source select transistors of the strings ST21 to ST2m arranged in a second row may be coupled to a second source select line SSL2. In other embodiments, the source select transistors of the strings ST11 to ST1m and ST21 to ST2m may be coupled in common to a single source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Accordingly, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11 to ST1m in the first row may be coupled to a first drain select line DSL1. The drain select transistors DST of the strings ST21 to ST2m in the second row may be coupled to a second drain select line DSL2.

Figure 5:
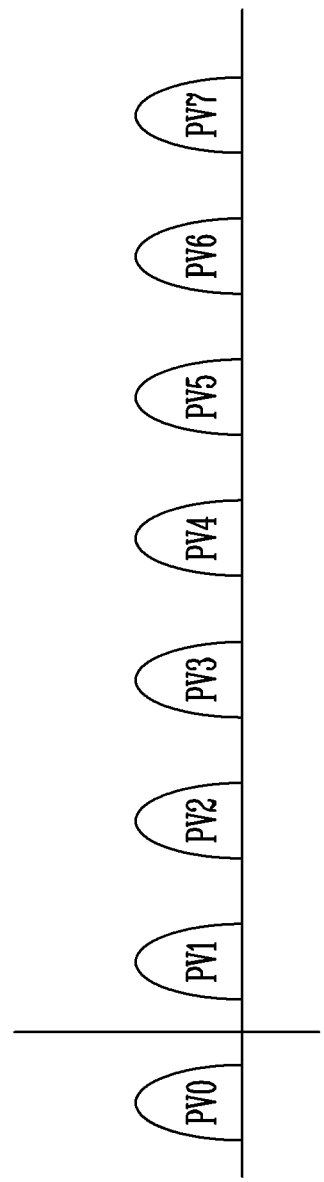
FIG. 5 is a threshold voltage distribution diagram for describing program states of programmed memory cells.

FIG. 5 is a threshold voltage distribution diagram for describing program states of programmed memory cells.

In an embodiment of the present disclosure, a description will be made based on a triple-level cell (TLC) program scheme, in which the number of threshold voltage distributions of memory cells is eight (e.g., PV0 to PV7), by way of example.

Referring to FIG. 5, during a program operation, each of the memory cells may be programmed to any one of an erased state PV0 and a plurality of program states PV1 to PV7. The memory cells included in a memory block prior to the performance of the program operation may have threshold voltages corresponding to the erased state PV0.

During a program operation, program operations may be sequentially performed on the memory cells in the erased state PV0 in a sequence from a program state having a low threshold voltage distribution, among the plurality of program states PV1 to PV7. For example, a program operation for the first program state PV1, a program operation for the second program state PV2, and a program operation for the third program state PV3, . . . , a program operation for the seventh program state PV7 may be sequentially performed.

During a program operation, a selected program state is defined as a target program state, and a program state that is adjacent to the target program state and higher than the target program state is defined as a pre-program state.

For example, during a program operation for the first program state PV1, the target program state may be the first program state PV1, and the pre-program state may be the second program state PV2.

Figure 6:
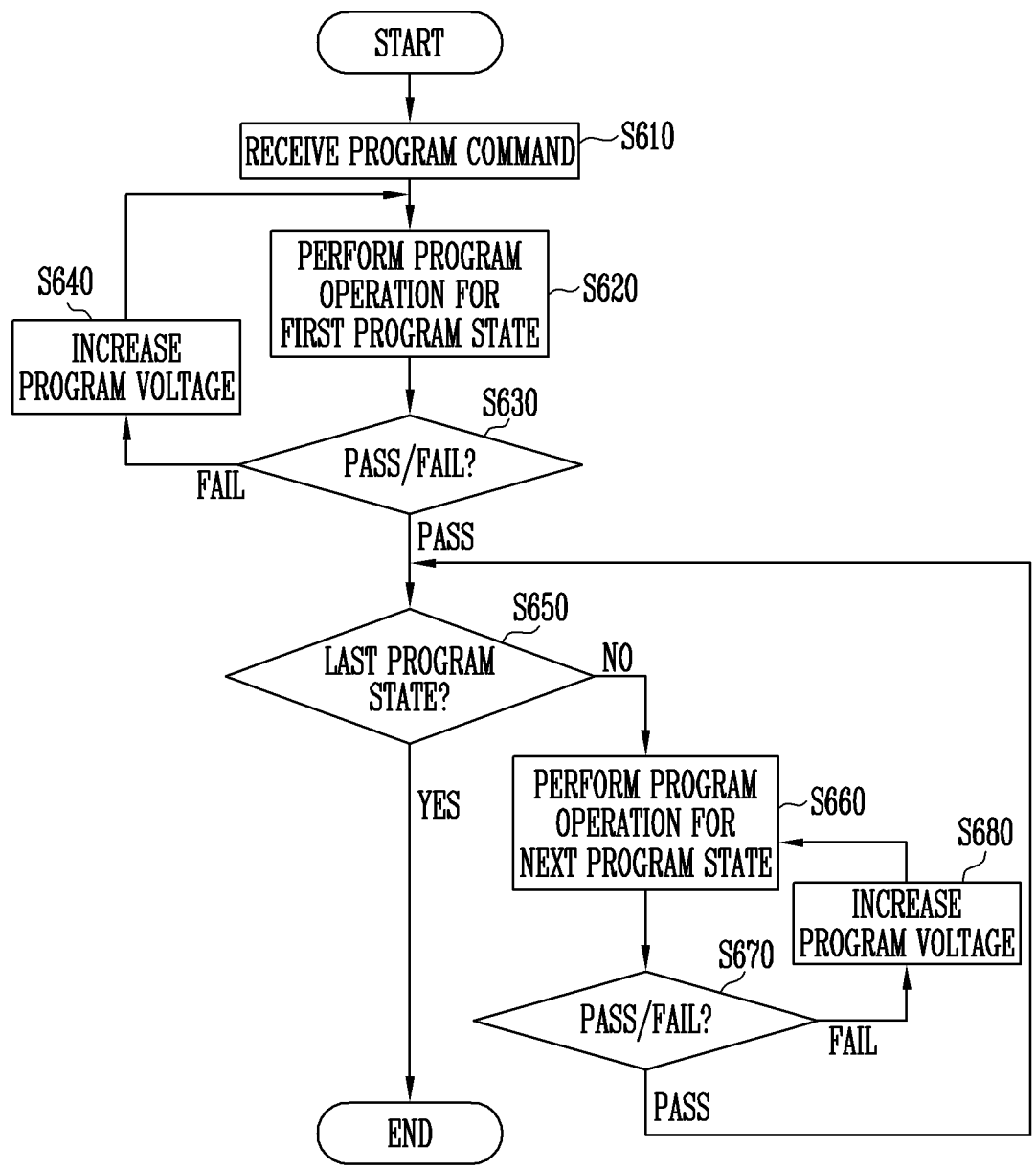
FIG. 6 is a flowchart illustrating a method of operating a memory device according to an embodiment of the present disclosure.

FIG. 6 is a flowchart illustrating a method of operating a memory device according to an embodiment of the present disclosure.

A method of operating a memory device according to an embodiment of the present disclosure will be described with reference to FIGS. 1 to 6.

When a request corresponding to a program operation is received from the host 2000, the memory controller 1200 may generate a program command CMD in response to the request from the host 2000.

The memory device 1100 may receive the program command CMD, an address ADD, and data DATA to be programmed from the memory controller 1200 at operation S610.

The memory device 1100 may select a memory block (e.g., MB1), on which the program operation is to be performed, from among the plurality of memory blocks MB1 to MBk in response to the received program command CMD and address ADD, sequentially program the selected memory block (e.g., MB1) on a page basis, and perform a program operation for the first program state PV1 having a lowest threshold voltage distribution, among the plurality of program states PV1 to PV7, using an incremental step pulse program (ISPP) scheme during the program operation on the selected page at operation S620.

The page buffer group 230 may temporarily store the data to be programmed in response to the page buffer control signals PBSIGNALS generated by the control logic 300, and may adjust the potential levels of the bit lines BL1 to BLm based on the temporarily stored data to be programmed. For example, a program permission voltage may be applied to bit lines corresponding to page buffers in which pieces of data corresponding to the first to seventh program states PV1 to PV7 are temporarily stored, and a program inhibition voltage may be applied to bit lines corresponding to page buffers in which pieces of data corresponding to the erased state PV0 are temporarily stored.

The voltage generation circuit 210 may generate a program voltage and a pass voltage in response to an operation signal OP_CMD. The row decoder 220 may apply the program voltage generated by the voltage generation circuit 210 to a word line corresponding to the selected page, among a plurality of word lines of the selected memory block (e.g., MB1) in response to row decoder control signals AD_signals, and may apply the pass voltage generated by the voltage generation circuit 20 to the remaining word lines.

Thereafter, the peripheral circuits 200 may check whether memory cells to be programmed to the first program state PV1 have been normally programmed by performing a program verify operation for the first program state PV1 at operation S630. In this case, the peripheral circuits 200 may check whether the memory cells to be programmed to an immediately higher program state PV2 than the first program state PV1 have been programmed to the first program state PV1, and may check memory cells that have been programmed to the immediately higher program state PV2, among memory cells to be programmed to the further higher program states PV3 to PV7.

For example, the peripheral circuits 200 may sequentially perform a program verify operation for the first program state PV1 and program verify operations for pre-program states, which is the operation of verifying the memory cells to be programmed to the further higher program states PV3 to PV7.

During the program verify operation for the first program state PV1, the voltage generation circuit 210 may generate a first verify voltage and a pass voltage, corresponding to the first program state PV1, in response to the operation signal OP_CMD. The row decoder 220 may apply the first verify voltage generated by the voltage generation circuit 210 to a word line corresponding to the selected page, among a plurality of word lines of the selected memory block (e.g., MB1) in response to row decoder control signals AD_signals, and may apply the pass voltage generated by the voltage generation circuit 20 to the remaining word lines. Further, during the program verify operation, the page buffers PB1 to PBm 231 may sense the voltages or currents of bit lines BL1 to BLm, and may then check whether the memory cells to be programmed to the first program state PV1 and the memory cells to be programmed to the second program state PV2 corresponding to the immediately higher program state have been programmed to the first program state PV1.

During the program verify operation for the pre-program state, the voltage generation circuit 210 may generate a second verify voltage and a pass voltage, corresponding to the immediately higher program state PV2, in response to the operation signal OP_CMD. The row decoder 220 may apply the second verify voltage generated by the voltage generation circuit 210 to a word line corresponding to the selected page, among a plurality of word lines of the selected memory block (e.g., MB1) in response to row decoder control signals AD_signals, and may apply the pass voltage generated by the voltage generation circuit 20 to the remaining word lines. Further, during a program verify operation, the page buffers PB1 to PBm 231 may sense the voltages or currents of the bit lines BL1 to BLm, and then check memory cells that have been programmed to the immediately higher program state PV2, among memory cells to be programmed to the third to seventh program states PV3 to PV7.

At the above-described operation S630, when the threshold voltages of some memory cells, among the memory cells to be programmed to the first program state PV1, have not reached the first program state PV1 or when the threshold voltages of some memory cells, among the memory cells to be programmed to the second program state PV2, have not reached the first program state PV1 (fail), the control logic 300 may reset the program voltage by increasing the program voltage by a step voltage at operation S640, and may re-perform operations starting from the above-described operation S620. When operation S620 is re-performed, a program inhibition voltage may be applied to bit lines corresponding to memory cells that are determined to have passed the program verify operation for the first program state PV1 and the program verify operation for the pre-program state, among the bit lines BL1 to BLm. Also, a program permission voltage may be applied to bit lines corresponding to memory cells that are determined to have failed the program verify operation for the first program state PV1 and the program verify operation for the pre-program state, among the bit lines BL1 to BLm.

At the above-described operation S630, when the threshold voltages of the memory cells to be programmed to the first program state PV1 and the second program state PV2 have reached the first program state PV1 (pass), the control logic 300 may determine whether the program operation currently being performed is a program operation for the last program state PV7 at operation S650.

When it is determined at operation S650 that the program operation currently being performed is not a program operation for the last program state PV7 (in case of No), a program operation for an immediately higher program state is performed at operation S660. For example, when the above-described program operation is the program operation for the first program state PV1, a program operation for the second program state PV2 may be performed.

The page buffer group 230 may adjust the potential levels of the bit lines BL1 to BLm based on the data to be programmed, which is temporarily stored in response to the page buffer control signals PBSIGNALS generated by the control logic 300. For example, a program permission voltage may be applied to bit lines corresponding to page buffers in which pieces of data corresponding to the second to seventh program states PV2 to PV7 are temporarily stored, and a program inhibition voltage may be applied to bit lines corresponding to page buffers in which pieces of data corresponding to the erased state PV0 and the first program state PV1 are temporarily stored.

The voltage generation circuit 210 may generate a program voltage and a pass voltage in response to the operation signal OP_CMD. The row decoder 220 may apply the program voltage generated by the voltage generation circuit 210 to a word line corresponding to the selected page, among the plurality of word lines of the selected memory block (e.g., MB1) in response to the row decoder control signals AD_signals, and may apply the pass voltage generated by the voltage generation circuit 20 to the remaining word lines.

Thereafter, the peripheral circuits 200 may check whether memory cells to be programmed to the second program state PV2 have been normally programmed by performing a program verify operation for the second program state PV2 at operation S670. In this case, the peripheral circuits 200 may check whether the memory cells to be programmed to an immediately higher program state PV3 than the second program state PV2 have been programmed to the second program state PV2, and may check memory cells that have been programmed to an immediately higher program state PV3, among memory cells to be programmed to the further higher program states PV4 to PV7. For example, the peripheral circuits 200 may sequentially perform a program verify operation for the second program state PV2 and a program verify operation for the pre-program states, which is the verify operation for the further higher program states PV4 to PV7.

During the program verify operation for the second program state PV2, the voltage generation circuit 210 may generate a second verify voltage and a pass voltage, corresponding to the second program state PV2, in response to the operation signal OP_CMD. The row decoder 220 may apply the second verify voltage generated by the voltage generation circuit 210 to a word line corresponding to the selected page, among a plurality of word lines of the selected memory block (e.g., MB1) in response to the row decoder control signals AD_signals, and may apply the pass voltage generated by the voltage generation circuit 20 to the remaining word lines. Further, during a program verify operation, the page buffers PB1 to PBm 231 may sense the voltages or currents of the bit lines BL1 to BLm, and then check whether the memory cells to be programmed to the second program state PV2 and the memory cells to be programmed to the immediately higher program state PV3 have been programmed to the second program state PV2.

During the program verify operation for the pre-program state, the voltage generation circuit 210 may generate a third verify voltage and a pass voltage, corresponding to the immediately higher program state PV3, in response to the operation signal OP_CMD. The row decoder 220 may apply the third verify voltage generated by the voltage generation circuit 210 to a word line corresponding to the selected page, among a plurality of word lines of the selected memory block (e.g., MB1) in response to the row decoder control signals AD_signals, and may apply the pass voltage generated by the voltage generation circuit 20 to the remaining word lines. Further, during a program verify operation, the page buffers PB1 to PBm 231 may sense the voltages or currents of the bit lines BL1 to BLm, and then check memory cells that have been programmed to the program state PV3, among the memory cells to be programmed to the fourth to seventh program states PV4 to PV7.

When the threshold voltages of some memory cells, among the memory cells to be programmed to the second program state PV2 and memory cells to be programmed to the immediately higher program state PV3 at the above-described operation S670, have not reached the second program state PV2 (fail), the control logic 300 may reset the program voltage by increasing the program voltage by a step voltage at operation S680, and may re-perform operations starting from operation S660. When operation S660 is re-performed, a program inhibition voltage may be applied to bit lines corresponding to memory cells that are determined to have passed the program verify operation for the second program state PV2 and the program verify operation for the pre-program state, among the bit lines BL1 to BLm. Also, a program permission voltage may be applied to bit lines corresponding to memory cells that are determined to have failed the program verify operation for the second program state PV2 and the program verify operation for the pre-program state, among the bit lines BL1 to BLm.

At the above-described operation S670, when the threshold voltages of the memory cells to be programmed to the second program state PV2 have reached the second program state PV2, and the threshold voltages of the memory cells to be programmed to the immediately higher program state PV3 have reached the second program state PV2 (pass), the control logic 300 may re-perform operations starting from operation S650 of determining whether the program operation currently being performed is a program operation for the last program state PV7.

Until it is determined at the above-described operation S650 that the program operation currently being performed is the last program state PV7, the foregoing operations S650 to S680 may be repeated. That is, program operations for the second to seventh program states PV2 to PV7 may be completed by repeating the forgoing operations S650 to S680. Here, during the program operation for the last program state PV7, a program operation for a pre-program state and a verify operation for the pre-program state are not performed.

When it is determined at operation S650 that the program operation currently being performed is the program operation for the last program state PV7, the foregoing operations S620 to S680 may be performed by selecting a next page of the selected memory block.

Figure 7:
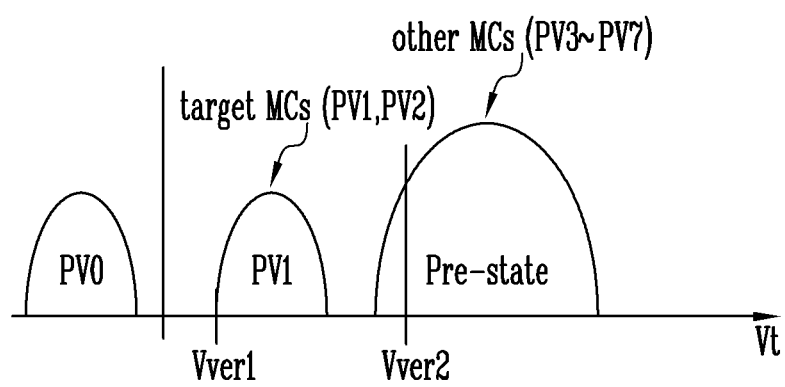
FIG. 7 is a threshold voltage distribution diagram of memory cells for describing a program operation for a first program state.

FIG. 7 is a threshold voltage distribution diagram of memory cells for describing a program operation for a first program state.

Threshold voltage distributions of memory cells during the program operation for the first program state PV1 will be described below with reference to FIG. 7.

Referring to FIG. 7, during the program operation for the first program state PV1, target memory cells (target MCs) that include memory cells to be programmed to the first program state PV1 and memory cells to be programmed to a program state PV2 immediately higher than the first program state PV1 may be programmed to have a threshold voltage distribution corresponding to the first program state PV1. For example, during a program voltage apply operation, the threshold voltage distribution may be increased by applying a program voltage to the word line of the target memory cells (target MCs). During a program verify operation, after a first verify voltage Vver1 has been applied to the word line of the target memory cells (targets MCs), the potential levels of the bit lines may be sensed, and thus whether the program verify operation has passed/failed may be determined. When it is determined that the program verify operation has failed as a result of the program verify operation, the program operation may be performed in such a way as to re-apply a program voltage increased by a step voltage to the word line of the target memory cells (target MCs). As a result, the target memory cells (target MCs) may have a threshold voltage distribution corresponding to the first program state PV1 higher than the first verify voltage Vver1.

During the program operation for the first program state PV1, the remaining memory cells (i.e., other MCs) intended to be programmed to third to seventh program states PV3 to PV7 may be programmed to a pre-program state (i.e., pre-state). The pre-program state (Pre-state) may be a state in which a threshold voltage distribution is higher than that in the first program state PV1. For example, until the above-described target memory cells (targets MCs) pass the program verify operation, the program operation may be performed on the remaining memory cells (other MCs), and the memory cells having a threshold voltage distribution higher than a second verify voltage Vver2 corresponding to the immediately higher program state PV2, among the remaining memory cells (other MCs), may be operated in a program-inhibit mode. As a result, at the same time that the target memory cells (target MCs) are programmed to the first program state PV1, the remaining memory cells (other MCs) may be programmed to a pre-program state (Pre-state) having a threshold voltage distribution higher than that in the first program state PV1.

Figure 8:
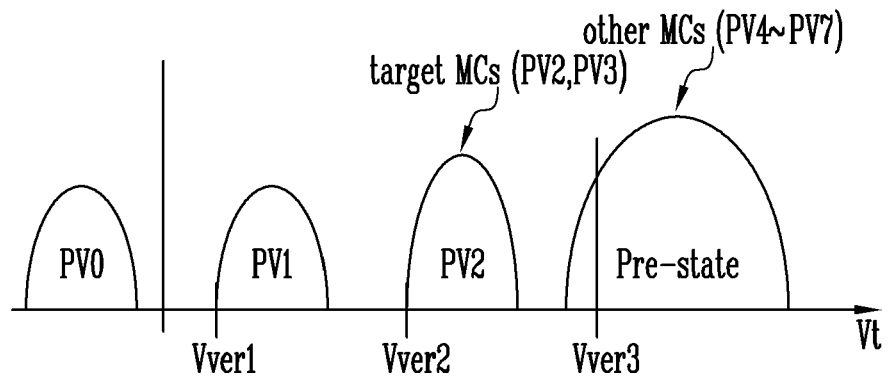
FIG. 8 is a threshold voltage distribution diagram of memory cells for describing a program operation for a second program state.

FIG. 8 is a threshold voltage distribution diagram of memory cells for describing a program operation for a second program state.

Threshold voltage distributions of memory cells during the program operation for the second program state PV2 will be described below with reference to FIG. 8.

Similarly to the above-described FIG. 7, after the program operation for the first program state PV1 has been completed, the program operation for the second program state PV2 is performed.

Referring to FIG. 8, during the program operation for the second program state PV2, target memory cells (target MCs)

that include memory cells to be programmed to the second program state PV2 and memory cells to be programmed to the immediately higher program state PV3 may be programmed to have a threshold voltage distribution corresponding to the second program state PV2. For example, during a program voltage apply operation, the threshold voltage distribution may be increased by applying a program voltage to the word line of the target memory cells (target MCs). During a program verify operation, after a second verify voltage Vver2 has been applied to the word line of the target memory cells (targets MCs), the potential levels of the bit lines may be sensed, and thus whether the program verify operation has passed/failed may be determined. When it is determined that the program verify operation has failed as a result of the program verify operation, the program operation may be performed in such a way as to re-apply a program voltage increased by a step voltage to the word line of the target memory cells (target MCs). As a result, the target memory cells (target MCs) may have a threshold voltage distribution corresponding to the second program state PV2 higher than the second verify voltage Vver2. During a program voltage apply operation, a program inhibition voltage may be applied to bit lines of the memory cells corresponding to an erased state PV0 and memory cells that have been programmed to the first program state PV1, thus preventing the threshold voltages of the memory cells from increasing.

During the program operation for the second program state PV2, the remaining memory cells (i.e., other MCs) intended to be programmed to fourth to seventh program states PV4 to PV7 may be programmed to a pre-program state (i.e., pre-state). The pre-program state (Pre-state) may be a state in which a threshold voltage distribution is higher than that in the second program state PV2. For example, until the above-described target memory cells (targets MCs) pass the program verify operation, the program operation may be performed on the remaining memory cells (other MCs), and the memory cells having a threshold voltage distribution higher than a third verify voltage Vver3 corresponding to the immediately higher program state PV3, among the remaining memory cells (other MCs), may be operated in a program-inhibit mode. As a result, at the same time that the target memory cells (target MCs) are programmed to the second program state PV2, the remaining memory cells (other MCs) may be programmed to a pre-program state (Pre-state) having a threshold voltage distribution higher than that in the second program state PV2.

Based on the program method described with reference to FIGS. 7 and 8, during respective program operations corresponding to first to sixth program states PV1 to P6, the remaining memory cells (other MCs) other than the target memory cells (target MCs) may be programmed to a pre-program state. Finally, during a program operation for the seventh program state PV7, only memory cells intended to be programmed to the seventh program state PV7 may be set as the target memory cells (targets MCs), and then a program operation may be performed on the target memory cells.

In accordance with an embodiment of the present disclosure, before a program operation for the target program state is performed, the threshold voltage distribution of target memory cells may increase up to a threshold voltage range adjacent to the target program state. Therefore, during the program operation for the target program state, the magnitude of an increased threshold voltage may be decreased, and thus the threshold voltage distribution may be improved.

Further, during the program operation, program operations for first to seventh program states are sequentially performed, and thus a program verify operation that is performed after the program voltage apply operation may be simplified from the verify operations for first to seventh program states to a verify operation for a target program state and a verify operation for a pre-program state.

FIG. 9 is a diagram describing program modes of memory cells depending on respective program states during a program operation according to an embodiment of the present disclosure.

Referring to FIG. 9, during a program operation for a first program state PV1, memory cells to be programmed to the first program state PV1 and memory cells to be programmed to a second program state PV2 adjacent to the first program state PV1 may be programmed to have a threshold voltage distribution corresponding to the first program state PV1. That is, bit lines corresponding to memory cells to be programmed to the first program state PV1 and memory cells to be programmed to the second program state PV2 may be controlled to a program mode (PGM MODE) in which a program permission voltage is applied.

Here, until the program operation on the memory cells to be programmed to the first program state PV1 and memory cells to be programmed to the second program state PV2 is terminated, memory cells to be programmed to the remaining program states PV3 to PV7 may be programmed to a pre-program state in which threshold voltage distributions of the memory cells are higher than that in the first program state PV1. For example, the program permission voltage may be applied to bit lines of memory cells having threshold voltages lower than that in the second program state PV2, among the memory cells to be programmed to the remaining program states PV3 to PV7, and a program inhibition voltage may be applied to bit lines of memory cells having threshold voltages equal to or higher than that in the second program state PV2. That is, among the memory cells to be programmed to the remaining program states PV3 to PV7, the memory cells having threshold voltages lower than that in the second program state PV2 may be controlled to the program mode (PGM MODE).

When the program operation for the first program state PV1 is completed, a program operation for the second program state PV2 is performed. During the program operation for the second program state PV2, memory cells to be programmed to the second program state PV2 and memory cells to be programmed to the third program state PV3 adjacent to the second program state PV2 may be programmed to have threshold voltage distributions corresponding to the second program state PV2. That is, bit lines corresponding to the memory cells to be programmed to the second program state PV2 and the memory cells to be programmed to the third program state PV3 may be controlled to a program mode (PGM MODE) in which a program permission voltage is applied. Here, the bit lines corresponding to the memory cells that have been programmed to the first program state PV1 may be controlled to a program-inhibit mode (INHIBIT MODE) in which a program inhibition voltage is applied.

Here, until the program operation on the memory cells to be programmed to the second program state PV2 and memory cells to be programmed to the third program state PV3 is terminated, memory cells to be programmed to the remaining program states PV4 to PV7 may be programmed to a pre-program state (pre-state) in which threshold voltage distributions of the memory cells are higher than that in the second program state PV2. For example, the program permission voltage may be applied to bit lines of memory cells having threshold voltages lower than that in the third program state PV3, among the memory cells to be programmed to the remaining program states PV4 to PV7, and the program inhibition voltage may be applied to bit lines of memory cells having threshold voltages equal to or higher than that in the third program state PV3. That is, among the memory cells to be programmed to the remaining program states PV4 to PV7, the memory cells having threshold voltages lower than that in the third program state PV3 may be controlled to the program mode (PGM MODE).

When the program operation for the second program state PV2 is completed, a program operation for the third program state PV3 is performed. During the program operation for the third program state PV3, memory cells to be programmed to the third program state PV3 and memory cells to be programmed to the fourth program state PV4 adjacent to the third program state PV3 may be programmed to have threshold voltage distributions corresponding to the third program state PV3. That is, bit lines corresponding to memory cells to be programmed to the third program state PV3 and memory cells to be programmed to the fourth program state PV4 may be controlled to the program mode (PGM MODE) in which the program permission voltage is applied. Here, bit lines corresponding to the memory cells that have been programmed to the first program state PV1 and memory cells that have been programmed to the second program state PV2 may be controlled to the program-inhibit mode (INHIBIT MODE) in which the program inhibition voltage is applied.

Here, until the program operation on the memory cells to be programmed to the third program state PV3 and memory cells to be programmed to the fourth program state PV4 is terminated, memory cells to be programmed to the remaining program states PV5 to PV7 may be programmed to a pre-program state in which threshold voltage distributions of the memory cells are higher than that in the third program state PV3. For example, the program permission voltage may be applied to bit lines of memory cells having threshold voltages lower than that in the fourth program state PV4, among the memory cells to be programmed to the remaining program states PV5 to PV7, and the program inhibition voltage may be applied to bit lines of memory cells having threshold voltages equal to or higher than that in the fourth program state PV4. That is, among the memory cells to be programmed to the remaining program states PV5 to PV7, the memory cells having threshold voltages lower than that in the fourth program state PV4 may be controlled to the program mode (PGM MODE).

When the program operation for the third program state PV3 is completed, a program operation for the fourth program state PV4 is performed. During the program operation for the fourth program state PV4, memory cells to be programmed to the fourth program state PV4 and memory cells to be programmed to the fifth program state PV5 adjacent to the fourth program state PV4 may be programmed to have threshold voltage distributions corresponding to the fourth program state PV4. That is, bit lines corresponding to memory cells to be programmed to the fourth program state PV4 and memory cells to be programmed to the fifth program state PV5 may be controlled to the program mode (PGM MODE) in which the program permission voltage is applied. Here, bit lines corresponding to the memory cells that have been programmed to the first to third program states PV1 to PV3 may be controlled to the program-inhibit mode (INHIBIT MODE) in which the program inhibition voltage is applied.

Here, until the program operation on the memory cells to be programmed to the fourth program state PV4 and memory cells to be programmed to the fifth program state PV5 is terminated, memory cells to be programmed to the remaining program states PV6 and PV7 may be programmed to a pre-program state in which threshold voltage distributions of the memory cells are higher than that in the fourth program state PV4. For example, the program permission voltage may be applied to bit lines of memory cells having threshold voltages lower than that in the fifth program state PV5, among the memory cells to be programmed to the remaining program states PV6 and PV7, and the program inhibition voltage may be applied to bit lines of memory cells having threshold voltages equal to or higher than that in the fifth program state PV5. That is, among the memory cells to be programmed to the remaining program states PV6 and PV7, the memory cells having threshold voltages lower than that in the fifth program state PV5 may be controlled to the program mode (PGM MODE).

When the program operation for the fourth program state PV4 is completed, a program operation for the fifth program state PV5 is performed. During the program operation for the fifth program state PV5, memory cells to be programmed to the fifth program state PV5 and memory cells to be programmed to the sixth program state PV6 adjacent to the fifth program state PV5 may be programmed to have threshold voltage distributions corresponding to the fifth program state PV5. That is, bit lines corresponding to the memory cells to be programmed to the fifth program state PV5 and the memory cells to be programmed to the sixth program state PV6 may be controlled to the program mode (PGM MODE) in which the program permission voltage is applied. Here, bit lines corresponding to the memory cells that have been programmed to the first to fourth program states PV1 to PV4 may be controlled to the program-inhibit mode (INHIBIT MODE) in which the program inhibition voltage is applied.

Here, until the program operation on the memory cells to be programmed to the fifth program state PV5 and memory cells to be programmed to the sixth program state PV6 is terminated, memory cells to be programmed to the remaining program state PV7 to PV7 may be programmed to a pre-program state (pre-state) in which threshold voltage distributions of the memory cells are higher than that in the fifth program state PV5. For example, the program permission voltage may be applied to bit lines of memory cells having threshold voltages lower than that in the sixth program state PV6, among the memory cells to be programmed to the remaining program state PV7, and the program inhibition voltage may be applied to bit lines of memory cells having threshold voltages equal to or higher than that in the sixth program state PV6. That is, among the memory cells to be programmed to the remaining program state PV7, the memory cells having threshold voltages lower than that in the sixth program state PV6 may be controlled to the program mode (PGM MODE).

When the program operation for the fifth program state PV5 is completed, a program operation for the sixth program state PV6 is performed. During the program operation for the sixth program state PV6, memory cells to be programmed to the sixth program state PV6 and memory cells to be programmed to the seventh program state PV7 adjacent to the sixth program state PV6 may be programmed to have threshold voltage distributions corresponding to the sixth program state PV6. That is, bit lines corresponding to memory cells to be programmed to the sixth program state PV6 and memory cells to be programmed to the seventh program state PV7 may be controlled to the program mode (PGM MODE) in which the program permission voltage is applied. Here, bit lines corresponding to the memory cells that have been programmed to the first to fifth program states PV1 to PV5 may be controlled to the program-inhibit mode (INHIBIT MODE) in which the program inhibition voltage is applied.

When the program operation for the sixth program state PV6 is completed, a program operation for the seventh program state PV7 is performed. During the program operation for the seventh program state PV7, the bit lines corresponding to memory cells to be programmed to the seventh program state PV7 may be controlled to the program mode (PGM mode) in which the program permission voltage is applied. Here, bit lines corresponding to the memory cells that have been programmed to the first to sixth program states PV1 to PV6 may be controlled to the program-inhibit mode (INHIBIT MODE) in which the program inhibition voltage is applied.

Although, in the above-described embodiment of the present disclosure, a description has been made based on the triple-level cell (TLC) program scheme in which the number of threshold voltage distributions of programmed memory cells is eighth (i.e., PV0 to PV7) by way of example, the present embodiment may also be applied to a multi-level cell (MLC) program scheme in which the number of threshold voltage distributions is four and to a quad-level cell (QLC) program scheme in which the number of threshold voltage distributions is 16.

FIG. 10 is a diagram for describing program modes of memory cells depending on respective program states during a program operation according to an embodiment of the present disclosure.

Referring to FIG. 10, during a program operation for a first program state PV1, memory cells to be programmed to the first program state PV1 may be programmed to have a threshold voltage distribution corresponding to the first program state PV1. That is, bit lines corresponding to the memory cells to be programmed to the first program state PV1 may be controlled to a program mode (PGM MODE) in which a program permission voltage is applied.

Here, until the program operation on the memory cells to be programmed to the first program state PV1 is terminated, memory cells to be programmed to the remaining program states PV2 to PV7 may be programmed to a pre-program state in which threshold voltage distributions of the memory cells are higher than that in the first program state PV1. For example, the program permission voltage may be applied to bit lines of memory cells having threshold voltages lower than that in the second program state PV2, among the memory cells to be programmed to the remaining program states PV2 to PV7, and a program inhibition voltage may be applied to bit lines of memory cells having threshold voltages equal to or higher than that in the second program state PV2. That is, among the memory cells to be programmed to the remaining program states PV2 to PV7, the memory cells having threshold voltages lower than that in the second program state PV2 may be controlled to the program mode (PGM MODE).

When the program operation for the first program state PV1 is terminated, a program operation for the second program state PV2 is performed. During the program operation for the second program state PV2, memory cells to be programmed to the second program state PV2 may be programmed to have a threshold voltage distribution corresponding to the second program state PV2. That is, bit lines corresponding to the memory cells to be programmed to the second program state PV2 may be controlled to the program mode (PGM MODE) in which the program permission voltage is applied. Here, the bit lines corresponding to the memory cells that have been programmed to the first program state PV1 may be controlled to a program-inhibit mode (INHIBIT MODE) in which a program inhibition voltage is applied.

Here, until the program operation on the memory cells to be programmed to the second program state PV2 is terminated, memory cells to be programmed to the remaining program states PV3 to PV7 may be programmed to a pre-program state in which threshold voltage distributions of the memory cells are higher than that in the second program state PV2. For example, the program permission voltage may be applied to bit lines of memory cells having threshold voltages lower than that in the third program state PV3, among the memory cells to be programmed to the remaining program states PV3 to PV7, and the program inhibition voltage may be applied to bit lines of memory cells having threshold voltages equal to or higher than that in the third program state PV3. That is, among the memory cells to be programmed to the remaining program states PV3 to PV7, the memory cells having threshold voltages lower than that in the third program state PV3 may be controlled to the program mode (PGM MODE).

When the program operation for the second program state PV2 is terminated, a program operation for the third program state PV3 is performed. During the program operation for the third program state PV3, memory cells to be programmed to the third program state PV3 may be programmed to have a threshold voltage distribution corresponding to the third program state PV3. That is, bit lines corresponding to the memory cells to be programmed to the third program state PV3 may be controlled to the program mode (PGM MODE) in which a program permission voltage is applied. Here, bit lines corresponding to the memory cells that have been programmed to the first program state PV1 and memory cells that have been programmed to the second program state PV2 may be controlled to the program-inhibit mode (INHIBIT MODE) in which the program inhibition voltage is applied.

Here, until the program operation on the memory cells to be programmed to the third program state PV3 is terminated, memory cells to be programmed to the remaining program states PV4 to PV7 may be programmed to a pre-program state in which threshold voltage distributions of the memory cells are higher than that in the third program state PV3. For example, the program permission voltage may be applied to bit lines of memory cells having threshold voltages lower than that in the fourth program state PV4, among the memory cells to be programmed to the remaining program states PV4 to PV7, and the program inhibition voltage may be applied to bit lines of memory cells having threshold voltages equal to or higher than that in the fourth program state PV4. That is, among the memory cells to be programmed to the remaining program states PV4 to PV7, the memory cells having threshold voltages lower than that in the fourth program state PV4 may be controlled to the program mode (PGM MODE).

When the program operation for the third program state PV3 is terminated, a program operation for the fourth program state PV4 is performed. During the program operation for the fourth program state PV4, memory cells to be programmed to the fourth program state PV4 may be programmed to have a threshold voltage distribution corresponding to the fourth program state PV4. That is, bit lines corresponding to the memory cells to be programmed to the fourth program state PV4 may be controlled to the program mode (PGM MODE) in which the program permission voltage is applied. Here, bit lines corresponding to the memory cells that have been programmed to the first to third program states PV1 to PV3 may be controlled to the program-inhibit mode (INHIBIT MODE) in which the program inhibition voltage is applied.

Here, until the program operation on the memory cells to be programmed to the fourth program state PV4 is terminated, memory cells to be programmed to the remaining program states PV5 to PV7 may be programmed to a pre-program state in which threshold voltage distributions of the memory cells are higher than that in the fourth program state PV4. For example, the program permission voltage may be applied to bit lines of memory cells having threshold voltages lower than that in the fifth program state PV5, among the memory cells to be programmed to the remaining program states PV5 to PV7, and the program inhibition voltage may be applied to bit lines of memory cells having threshold voltages equal to or higher than that in the fifth program state PV5. That is, among the memory cells to be programmed to the remaining program states PV5 to PV7, the memory cells having threshold voltages lower than that in the fifth program state PV5 may be controlled to the program mode (PGM MODE).

When the program operation for the fourth program state PV4 is terminated, a program operation for the fifth program state PV5 is performed. During the program operation for the fifth program state PV5, memory cells to be programmed to the fifth program state PV5 may be programmed to have a threshold voltage distribution corresponding to the fifth program state PV5. That is, bit lines corresponding to the memory cells to be programmed to the fifth program state PV5 may be controlled to the program mode (PGM MODE) in which the program permission voltage is applied. Here, bit lines corresponding to the memory cells that have been programmed to the first to fourth program states PV1 to PV4 may be controlled to the program-inhibit mode (INHIBIT MODE) in which the program inhibition voltage is applied.

Here, until the program operation on the memory cells to be programmed to the fifth program state PV5 is terminated, memory cells to be programmed to the remaining program states PV6 and PV7 may be programmed to a pre-program state in which threshold voltage distributions of the memory cells are higher than that in the fifth program state PV5. For example, the program permission voltage may be applied to bit lines of memory cells having threshold voltages lower than that in the sixth program state PV6, among the memory cells to be programmed to the remaining program states PV6 and PV7, and the program inhibition voltage may be applied to bit lines of memory cells having threshold voltages equal to or higher than that in the sixth program state PV6. That is, among the memory cells to be programmed to the remaining program states PV6 and PV7, the memory cells having threshold voltages lower than that in the sixth program state PV6 may be controlled to the program mode (PGM MODE).

When the program operation for the fifth program state PV5 is terminated, a program operation for the sixth program state PV6 is performed. During the program operation for the sixth program state PV6, memory cells to be programmed to the sixth program state PV6 may be programmed to have a threshold voltage distribution corresponding to the sixth program state PV6. That is, bit lines corresponding to the memory cells to be programmed to the sixth program state PV6 may be controlled to the program mode (PGM MODE) in which the program permission voltage is applied. Here, bit lines corresponding to the memory cells that have been programmed to the first to fifth program states PV1 to PV5 may be controlled to the program-inhibit mode (INHIBIT MODE) in which the program inhibition voltage is applied.

Here, until the program operation on the memory cells to be programmed to the sixth program state PV6 is terminated, memory cells to be programmed to the remaining program state PV7 may be programmed to a pre-program state in which the threshold voltage distribution of the memory cells is higher than that in the sixth program state PV6. For example, the program permission voltage may be applied to bit lines of memory cells having threshold voltages lower than that in the seventh program state PV7, among the memory cells to be programmed to the remaining program state PV7, and the program inhibition voltage may be applied to bit lines of memory cells having threshold voltages equal to or higher than that in the seventh program state PV7. That is, among the memory cells to be programmed to the remaining program state PV7, the memory cells having threshold voltages lower than that in the seventh program state PV7 may be controlled to the program mode (PGM MODE).

When the program operation for the sixth program state PV6 is terminated, a program operation for the seventh program state PV7 is performed. During the program operation for the seventh program state PV7, the bit lines corresponding to memory cells to be programmed to the seventh program state PV7 may be controlled to the program mode (PGM mode) in which the program permission voltage is applied. Here, bit lines corresponding to the memory cells that have been programmed to the first to sixth program states PV1 to PV6 may be controlled to the program-inhibit mode (INHIBIT MODE) in which the program inhibition voltage is applied.

FIG. 11 is a diagram for describing program modes of memory cells depending on respective program states during a program operation according to an embodiment of the present disclosure.

Referring to FIG. 11, during a program operation for a first program state PV1, memory cells to be programmed to the first program state PV1, memory cells to be programmed to second and third program states PV2 and PV3 adjacent to the first program state PV1 may be programmed to have a threshold voltage distribution corresponding to the first program state PV1. That is, bit lines corresponding to the memory cells to be programmed to the first to third program states PV1 to PV3 may be controlled to a program mode (PGM MODE) in which a program permission voltage is applied.

Here, until the program operation on the memory cells to be programmed to the first program state PV1 to the third program state PV3 is terminated, memory cells to be programmed to the remaining program states PV4 to PV7 may be programmed to a pre-program state (pre-state) in which threshold voltage distributions of the memory cells are higher than that in the first program state PV1. For example, the program permission voltage may be applied to bit lines of memory cells having threshold voltages lower than that in the second program state PV2, among the memory cells to be programmed to the remaining program states PV4 to PV7, and a program inhibition voltage may be applied to bit lines of memory cells having threshold voltages equal to or higher than that in the second program state PV2. That is, among the memory cells to be programmed to the remaining program states PV4 to PV7, the memory cells having threshold voltages lower than that in the second program state PV2 may be controlled to the program mode (PGM MODE).

When the program operation for the first program state PV1 is completed, a program operation for the second program state PV2 is performed. During the program operation for the second program state PV2, memory cells to be programmed to the second program state PV2 and memory cells to be programmed to the third and fourth program states PV3 and PV4 adjacent to the second program state PV2 may be programmed to have a threshold voltage distribution corresponding to the second program state PV2. That is, bit lines corresponding to the memory cells to be programmed to the second to fourth program states PV2 to PV4 may be controlled to the program mode (PGM MODE) in which the program permission voltage is applied. Here, the bit lines corresponding to the memory cells that have been programmed to the first program state PV1 may be controlled to a program-inhibit mode (INHIBIT MODE) in which a program inhibition voltage is applied.

Here, until the program operation on the memory cells to be programmed to the second to fourth program states PV2 to PV4 is terminated, memory cells to be programmed to the remaining program states PV5 to PV7 may be programmed to a pre-program state in which threshold voltage distributions of the memory cells are higher than that in the second program state PV2. For example, the program permission voltage may be applied to bit lines of memory cells having threshold voltages lower than that in the third program state PV3, among the memory cells to be programmed to the remaining program states PV5 to PV7, and the program inhibition voltage may be applied to bit lines of memory cells having threshold voltages equal to or higher than that in the third program state PV3. That is, among the memory cells to be programmed to the remaining program states PV5 to PV7, the memory cells having threshold voltages lower than that in the third program state PV3 may be controlled to the program mode (PGM MODE).

When the program operation for the second program state PV2 is completed, a program operation for the third program state PV3 is performed. During the program operation for the third program state PV3, memory cells to be programmed to the third program state PV3 and memory cells to be programmed to the fourth and fifth program states PV4 and PV5 adjacent to the third program state PV3 may be programmed to have a threshold voltage distribution corresponding to the third program state PV3. That is, bit lines corresponding to the memory cells to be programmed to the third to fifth program states PV3 to PV5 may be controlled to the program mode (PGM MODE) in which the program permission voltage is applied. Here, bit lines corresponding to the memory cells that have been programmed to the first program state PV1 and the memory cells that have been programmed to the second program state PV2 may be controlled to the program-inhibit mode (INHIBIT MODE) in which the program inhibition voltage is applied.

Here, until the program operation on the memory cells to be programmed to the third to fifth program states PV3 to PV5 is terminated, memory cells to be programmed to the remaining program states PV6 and PV7 may be programmed to a pre-program state in which threshold voltage distributions of the memory cells are higher than that in the third program state PV3. For example, the program permission voltage may be applied to bit lines of memory cells having threshold voltages lower than that in the fourth program state PV4, among the memory cells to be programmed to the remaining program states PV6 and PV7, and the program inhibition voltage may be applied to bit lines of memory cells having threshold voltages equal to or higher than that in the fourth program state PV4. That is, among the memory cells to be programmed to the remaining program states PV6 and PV7, the memory cells having threshold voltages lower than that in the fourth program state PV4 may be controlled to the program mode (PGM MODE).

When the program operation for the third program state PV3 is completed, a program operation for the fourth program state PV4 is performed. During the program operation for the fourth program state PV4, memory cells to be programmed to the fourth program state PV4 and memory cells to be programmed to the fifth and sixth program states PV5 and PV6 adjacent to the fourth program state PV4 may be programmed to have a threshold voltage distribution corresponding to the fourth program state PV4. That is, bit lines corresponding to the memory cells to be programmed to the fourth to sixth program states PV4 to PV6 may be controlled to the program mode (PGM MODE) in which the program permission voltage is applied. Here, bit lines corresponding to the memory cells that have been programmed to the first to third program states PV1 to PV3 may be controlled to the program-inhibit mode (INHIBIT MODE) in which the program inhibition voltage is applied.

Here, until the program operation on the memory cells to be programmed to the fourth program state PV4 to the sixth program state PV6 is terminated, memory cells to be programmed to the remaining program state PV7 may be programmed to a pre-program state in which the threshold voltage distribution of the memory cells is higher than that in the fourth program state PV4. For example, the program permission voltage may be applied to bit lines of memory cells having threshold voltages lower than that in the fifth program state PV5, among the memory cells to be programmed to the remaining program state PV7, and the program inhibition voltage may be applied to bit lines of memory cells having threshold voltages equal to or higher than that in the fifth program state PV5. That is, among the memory cells to be programmed to the remaining program state PV7, the memory cells having threshold voltages lower than that in the fifth program state PV5 may be controlled to the program mode (PGM MODE).

When the program operation for the fourth program state PV4 is completed, a program operation for the fifth program state PV5 is performed. During the program operation for the fifth program state PV5, memory cells to be programmed to the fifth program state PV5 and memory cells to be programmed to the sixth and seventh program states PV6 and PV7 adjacent to the fifth program state PV5 may be programmed to have a threshold voltage distribution corresponding to the fifth program state PV5. That is, bit lines corresponding to the memory cells to be programmed to the fifth to seventh program states PV5 to PV7 may be controlled to the program mode (PGM MODE) in which the program permission voltage is applied. Here, bit lines corresponding to the memory cells that have been programmed to the first to fourth program states PV1 to PV4 may be controlled to the program-inhibit mode (INHIBIT MODE) in which the program inhibition voltage is applied.

When the program operation for the fifth program state PV5 is completed, a program operation for the sixth program state PV6 is performed. During the program operation for the sixth program state PV6, memory cells to be programmed to the sixth program state PV6 and memory cells to be programmed to the seventh program state PV7 adjacent to the sixth program state PV6 may be programmed to have threshold voltage distributions corresponding to the sixth program state PV6. That is, bit lines corresponding to memory cells to be programmed to the sixth program state PV6 and memory cells to be programmed to the seventh program state PV7 may be controlled to the program mode (PGM MODE) in which the program permission voltage is applied. Here, bit lines corresponding to the memory cells that have been programmed to the first to fifth program states PV1 to PV5 may be controlled to the program-inhibit mode (INHIBIT MODE) in which the program inhibition voltage is applied.

When the program operation for the sixth program state PV6 is completed, a program operation for the seventh program state PV7 is performed. During the program operation for the seventh program state PV7, the bit lines corresponding to memory cells to be programmed to the seventh program state PV7 may be controlled to the program mode (PGM mode) in which the program permission voltage is applied. Here, bit lines corresponding to the memory cells that have been programmed to the first to sixth program states PV1 to PV6 may be controlled to the program-inhibit mode (INHIBIT MODE) in which the program inhibition voltage is applied.

FIG. 12 is a diagram for describing program modes of memory cells depending on respective program states during a program operation according to an embodiment of the present disclosure.

Referring to FIG. 12, during a program operation for a first program state PV1, memory cells to be programmed to the first program state PV1 may be programmed to have a threshold voltage distribution corresponding to the first program state PV1. That is, bit lines corresponding to the memory cells to be programmed to the first program state PV1 may be controlled to a program mode (PGM MODE) in which a program permission voltage is applied.

Here, until the program operation on the memory cells to be programmed to the first program state PV1 is terminated, memory cells to be programmed to the remaining program states PV2 to PV7 may be programmed to a pre-program state higher than the first program state PV1. For example, a program permission voltage may be applied to bit lines of memory cells having threshold voltages lower than that in the second program state PV2, among memory cells to be programmed to the second program state PV2 and the third program state PV3 adjacent to the first program state PV1, and a program inhibition voltage may be applied to bit lines of memory cells having threshold voltages equal to or higher than that in the second program state PV2. Further, the program permission voltage may be applied to bit lines of memory cells having threshold voltages lower than that in the third program state PV3, among the memory cells to be programmed to the remaining program states PV4 to PV7, and the program inhibition voltage may be applied to bit lines of memory cells having threshold voltages equal to or higher than that in the third program state PV3.

That is, among the memory cells to be programmed to the second and third program states PV2 and PV3, memory cells having threshold voltages lower than that in the second program state PV2 may be controlled to the program mode (PGM MODE). Also, among memory cells to be programmed to the program states PV4 to PV7, memory cells having threshold voltages lower than that in the third program state PV3 may be controlled to the program mode (PGM MODE).

When the program operation for the first program state PV1 is terminated, a program operation for the second program state PV2 is performed. During the program operation for the second program state PV2, memory cells to be programmed to the second program state PV2 may be programmed to have a threshold voltage distribution corresponding to the second program state PV2. That is, bit lines corresponding to the memory cells to be programmed to the second program state PV2 may be controlled to the program mode (PGM MODE) in which the program permission voltage is applied.

Here, until the program operation on the memory cells to be programmed to the second program state PV2 is terminated, memory cells to be programmed to the remaining program states PV3 to PV7 may be programmed to a pre-program state higher than the second program state PV2. For example, the program permission voltage may be applied to bit lines of memory cells having threshold voltages lower than that in the third program state PV3, among memory cells to be programmed to the third and fourth program states PV3 and PV4 adjacent to the second program state PV2, and the program inhibition voltage may be applied to bit lines of memory cells having threshold voltages equal to or higher than that in the third program state PV3. Further, the program permission voltage may be applied to bit lines of memory cells having threshold voltages lower than that in the fourth program state PV4, among the memory cells to be programmed to the remaining program states PV5 to PV7, and the program inhibition voltage may be applied to bit lines of memory cells having threshold voltages equal to or higher than that in the fourth program state PV4.

That is, among the memory cells to be programmed to the third and fourth program states PV3 and PV4, memory cells having threshold voltages lower than that in the third program state PV3 may be controlled to the program mode (PGM MODE). Also, among the memory cells to be programmed to the program states PV5 to PV7, memory cells having threshold voltages lower than that in the fourth program state PV4 may be controlled to the program mode (PGM MODE).

When the program operation for the second program state PV2 is terminated, a program operation for the third program state PV3 is performed. During the program operation for the third program state PV3, memory cells to be programmed to the third program state PV3 may be programmed to have a threshold voltage distribution corresponding to the third program state PV3. That is, bit lines corresponding to the memory cells to be programmed to the third program state PV3 may be controlled to the program mode (PGM MODE) in which a program permission voltage is applied.

Here, until the program operation on the memory cells to be programmed to the third program state PV3 is terminated, memory cells to be programmed to the remaining program states PV4 to PV7 may be programmed to a pre-program state higher than the third program state PV3. For example, the program permission voltage may be applied to bit lines of memory cells having threshold voltages lower than that in the fourth program state PV4, among memory cells to be programmed to the fourth and fifth program states PV4 and PV5 adjacent to the third program state PV3, and the program inhibition voltage may be applied to bit lines of memory cells having threshold voltages equal to or higher than that in the fourth program state PV4. Furthermore, the program permission voltage may be applied to bit lines of memory cells having threshold voltages lower than that in the fifth program state PV5, among the memory cells to be programmed to the remaining program states PV6 and PV7, and the program inhibition voltage may be applied to bit lines of memory cells having threshold voltages equal to or higher than that in the fifth program state PV5.

That is, among the memory cells to be programmed to the fourth and fifth program states PV4 and PV5, memory cells having threshold voltages lower than that in the fourth program state PV4 may be controlled to the program mode (PGM MODE). Also, among the memory cells to be programmed to the program states PV6 and PV7, memory cells having threshold voltages lower than that in the fifth program state PV5 may be controlled to the program mode (PGM MODE).

When the program operation for the third program state PV3 is terminated, a program operation for the fourth program state PV4 is performed. During the program operation for the fourth program state PV4, memory cells to be programmed to the fourth program state PV4 may be programmed to have a threshold voltage distribution corresponding to the fourth program state PV4. That is, bit lines corresponding to the memory cells to be programmed to the fourth program state PV4 may be controlled to the program mode (PGM MODE) in which the program permission voltage is applied.

Here, until the program operation on the memory cells to be programmed to the fourth program state PV4 is terminated, memory cells to be programmed to the remaining program states PV5 to PV7 may be programmed to a pre-program state higher than the fourth program state PV4. For example, the program permission voltage may be applied to bit lines of memory cells having threshold voltages lower than that in the fifth program state PV5, among memory cells to be programmed to the fifth and sixth program states PV5 and PV6 adjacent to the fourth program state PV4, and the program inhibition voltage may be applied to bit lines of memory cells having threshold voltages equal to or higher than that in the fifth program state PV5. Further, the program permission voltage may be applied to bit lines of memory cells having threshold voltages lower than that in the sixth program state PV6, among the memory cells to be programmed to the remaining program state PV7, and the program inhibition voltage may be applied to bit lines of memory cells having threshold voltages equal to or higher than that in the sixth program state PV6.

That is, among the memory cells to be programmed to the fifth and sixth program states PV5 and PV6, memory cells having threshold voltages lower than that in the fifth program state PV5 may be controlled to the program mode (PGM MODE). Also, among memory cells to be programmed to the program state PV7, memory cells having threshold voltages lower than that in the sixth program state PV6 may be controlled to the program mode (PGM MODE).

When the program operation for the fourth program state PV4 is terminated, a program operation for the fifth program state PV5 is performed. During the program operation for the fifth program state PV5, memory cells to be programmed to the fifth program state PV5 may be programmed to have a threshold voltage distribution corresponding to the fifth program state PV5. That is, bit lines corresponding to the memory cells to be programmed to the fifth program state PV5 may be controlled to the program mode (PGM MODE) in which the program permission voltage is applied.

Here, until the program operation on the memory cells to be programmed to the fifth program state PV5 is terminated, memory cells to be programmed to the remaining program states PV6 and PV7 may be programmed to a pre-program state higher than the fifth program state PV5. For example, the program permission voltage may be applied to bit lines of memory cells having threshold voltages lower than that in the sixth program state PV6, among memory cells to be programmed to the sixth and seventh program states PV6 and PV7 adjacent to the fifth program state PV5, and the program inhibition voltage may be applied to bit lines of memory cells having threshold voltages equal to or higher than that in the sixth program state PV6.

That is, among the memory cells to be programmed to the sixth and seventh program states PV6 and PV7, the memory cells having threshold voltages lower than that in the sixth program state PV6 may be controlled to the program mode (PGM MODE).

When the program operation for the fifth program state PV5 is terminated, a program operation for the sixth program state PV6 is performed. During the program operation for the sixth program state PV6, memory cells to be programmed to the sixth program state PV6 may be programmed to have a threshold voltage distribution corresponding to the sixth program state PV6. That is, bit lines corresponding to the memory cells to be programmed to the sixth program state PV6 may be controlled to the program mode (PGM MODE) in which the program permission voltage is applied.

Here, until the program operation on the memory cells to be programmed to the sixth program state PV6 is terminated, memory cells to be programmed to the remaining program state PV7 may be programmed to a pre-program state higher than the sixth program state PV6. For example, the program permission voltage may be applied to bit lines of memory cells having threshold voltages lower than that in the seventh program state PV7, among the memory cells to be programmed to the seventh program state PV7, and the program inhibition voltage may be applied to bit lines of memory cells having threshold voltages equal to or higher than that in the seventh program state PV7.

That is, among the memory cells to be programmed to the seventh program state PV7, the memory cells having threshold voltages lower than that in the seventh program state PV7 may be controlled to the program mode (PGM MODE).

When the program operation for the sixth program state PV6 is terminated, a program operation for the seventh program state PV7 is performed. During the program operation for the seventh program state PV7, memory cells to be programmed to the seventh program state PV7 may be programmed to have a threshold voltage distribution corresponding to the seventh program state PV7. That is, bit lines corresponding to the memory cells to be programmed to the seventh program state PV7 may be controlled to the program mode (PGM MODE) in which the program permission voltage is applied.

FIG. 13 is a diagram for describing program modes of memory cells depending on respective program states during a program operation according to an embodiment of the present disclosure.

Referring to FIG. 13, during a program operation for a first program state PV1, memory cells to be programmed to the first program state PV1 and memory cells to be programmed to a second program state PV2 adjacent to the first program state PV1 may be programmed to have a threshold voltage distribution corresponding to the first program state PV1. That is, bit lines corresponding to memory cells to be programmed to the first program state PV1 and memory cells to be programmed to the second program state PV2 may be controlled to a program mode (PGM MODE) in which a program permission voltage is applied.

Here, until the program operation on the memory cells to be programmed to the first program state PV1 and the memory cells to be programmed to the second program state PV2 is terminated, memory cells to be programmed to the remaining program states PV3 to PV7 may be programmed to a pre-program state in which threshold voltage distributions of the memory cells are higher than that in the first program state PV1.

For example, memory cells to be programmed to the third program state PV3 and the fourth program state PV4, in which threshold voltage distributions are relatively low, and memory cells to be programmed to the fifth program state PV5 to the seventh program state PV7, in which threshold voltage distributions are relatively high, among the remaining program states PV3 to PV7, may be programmed to have different threshold voltage distributions. For example, the program permission voltage may be applied to bit lines of memory cells having threshold voltages lower than that in the second program state PV2, among the memory cells to be programmed to the third program state PV3 and the fourth program state PV4, and a program inhibition voltage may be applied to bit lines of memory cells having threshold voltages equal to or higher than that in the second program state PV2. That is, among the memory cells to be programmed to the third and fourth program states PV3 and PV4, the memory cells having threshold voltages lower than that in the second program state PV2 may be controlled to the program mode (PGM MODE). Further, the program permission voltage may be applied to bit lines of memory cells having threshold voltages lower than that in the third program state PV3, among the memory cells to be programmed to the fifth to seventh program states PV5 to PV7, and the program inhibition voltage may be applied to bit lines of memory cells having threshold voltages equal to or higher than that in the third program state PV3. That is, among the memory cells to be programmed to the fifth to seventh program states PV5 to PV7, the memory cells having threshold voltages lower than that in the third program state PV3 may be controlled to the program mode (PGM MODE).

When the program operation for the first program state PV1 is completed, a program operation for the second program state PV2 is performed. During the program operation for the second program state PV2, memory cells to be programmed to the second program state PV2 and memory cells to be programmed to the third program state PV3 adjacent to the second program state PV2 may be programmed to have threshold voltage distributions corresponding to the second program state PV2. That is, bit lines corresponding to the memory cells to be programmed to the second program state PV2 and the memory cells to be programmed to the third program state PV3 may be controlled to a program mode (PGM MODE) in which the program permission voltage is applied. Here, the bit lines corresponding to the memory cells that have been programmed to the first program state PV1 may be controlled to a program-inhibit mode (INHIBIT MODE) in which the program inhibition voltage is applied.

Here, until the program operation on the memory cells to be programmed to the second program state PV2 and the memory cells to be programmed to the third program state PV3 is terminated, memory cells to be programmed to the remaining program states PV4 to PV7 may be programmed to a pre-program state (pre-state) in which threshold voltage distributions of the memory cells are higher than that in the second program state PV2.

For example, memory cells to be programmed to the fourth program state PV4 and the fifth program state PV5, in which threshold voltage distributions are relatively low, and memory cells to be programmed to the sixth program state PV6 and the seventh program state PV7, in which threshold voltage distributions are relatively high, among the remaining program states PV4 to PV7, may be programmed to have different threshold voltage distributions. For example, the program permission voltage may be applied to bit lines of memory cells having threshold voltages lower than that in the third program state PV3, among the memory cells to be programmed to the fourth program state PV4 and the fifth program state PV5, and the program inhibition voltage may be applied to bit lines of memory cells having threshold voltages equal to or higher than that in the third program state PV3. That is, among the memory cells to be programmed to the fourth and fifth program states PV4 and PV5, the memory cells having threshold voltages lower than that in the third program state PV3 may be controlled to the program mode (PGM MODE). Further, the program permission voltage may be applied to bit lines of memory cells having threshold voltages lower than that in the fourth program state PV4, among the memory cells to be programmed to the sixth and seventh program states PV6 and PV7, and the program inhibition voltage may be applied to bit lines of memory cells having threshold voltages equal to or higher than that in the fourth program state PV4. That is, among the memory cells to be programmed to the sixth and seventh program states PV6 and PV7, the memory cells having threshold voltages lower than that in the fourth program state PV4 may be controlled to the program mode (PGM MODE).

When the program operation for the second program state PV2 is completed, a program operation for the third program state PV3 is performed. During the program operation for the third program state PV3, memory cells to be programmed to the third program state PV3 and memory cells to be programmed to the fourth program state PV4 adjacent to the third program state PV3 may be programmed to have a threshold voltage distribution corresponding to the third program state PV3. That is, bit lines corresponding to memory cells to be programmed to the third program state PV3 and memory cells to be programmed to the fourth program state PV4 may be controlled to the program mode (PGM MODE) in which the program permission voltage is applied. Here, the bit lines corresponding to the memory cells that have been programmed to the first program state PV1 and the second program state PV2 may be controlled to a program-inhibit mode (INHIBIT MODE) in which the program inhibition voltage is applied.

Here, until the program operation on the memory cells to be programmed to the third program state PV3 and memory cells to be programmed to the fourth program state PV4 is terminated, memory cells to be programmed to the remaining program states PV5 to PV7 may be programmed to a pre-program state in which threshold voltage distributions of the memory cells are higher than that in the third program state PV3.

For example, memory cells to be programmed to the fifth and sixth program states PV5 and PV6, in which threshold voltage distributions are relatively low, and memory cells to be programmed to the seventh program state PV7, in which a threshold voltage distribution is relatively high, among the remaining program states PV5 to PV7, may be programmed to different threshold voltage distributions. For example, the program permission voltage may be applied to bit lines of memory cells having threshold voltages lower than that in the fourth program state PV4, among the memory cells to be programmed to the fifth program state PV5 and the sixth program state PV6, and the program inhibition voltage may be applied to bit lines of memory cells having threshold voltages equal to or higher than that in the fourth program state PV4. That is, among the memory cells to be programmed to the fifth and sixth program states PV5 and PV6, the memory cells having threshold voltages lower than that in the fourth program state PV4 may be controlled to the program mode (PGM MODE). Further, the program permission voltage may be applied to bit lines of memory cells having threshold voltages lower than that in the fifth program state PV5, among the memory cells to be programmed to the seventh program state PV7, and the program inhibition voltage may be applied to bit lines of memory cells having threshold voltages equal to or higher than that in the fifth program state PV5. That is, among the memory cells to be programmed to the seventh program state PV7, the memory cells having threshold voltages lower than that in the fifth program state PV5 may be controlled to the program mode (PGM MODE).

When the program operation for the third program state PV3 is completed, a program operation for the fourth program state PV4 is performed. During the program operation for the fourth program state PV4, memory cells to be programmed to the fourth program state PV4 and memory cells to be programmed to the fifth program state PV5 adjacent to the fourth program state PV4 may be programmed to have threshold voltage distributions corresponding to the fourth program state PV4. That is, bit lines corresponding to memory cells to be programmed to the fourth program state PV4 and memory cells to be programmed to the fifth program state PV5 may be controlled to the program mode (PGM MODE) in which the program permission voltage is applied. Here, bit lines corresponding to the memory cells that have been programmed to the first to third program states PV1 to PV3 may be controlled to the program-inhibit mode (INHIBIT MODE) in which the program inhibition voltage is applied.

Here, until the program operation on the memory cells to be programmed to the fourth program state PV4 and memory cells to be programmed to the fifth program state PV5 is terminated, memory cells to be programmed to the remaining program states PV6 and PV7 may be programmed to a pre-program state in which threshold voltage distributions of the memory cells are higher than that in the fourth program state PV4. For example, the program permission voltage may be applied to bit lines of memory cells having threshold voltages lower than that in the fifth program state PV5, among the memory cells to be programmed to the remaining program states PV6 and PV7, and the program inhibition voltage may be applied to bit lines of memory cells having threshold voltages equal to or higher than that in the fifth program state PV5. That is, among the memory cells to be programmed to the remaining program states PV6 and PV7, the memory cells having threshold voltages lower than that in the fifth program state PV5 may be controlled to the program mode (PGM MODE).

When the program operation for the fourth program state PV4 is completed, a program operation for the fifth program state PV5 is performed. During the program operation for the fifth program state PV5, memory cells to be programmed to the fifth program state PV5 and memory cells to be programmed to the sixth program state PV6 adjacent to the fifth program state PV5 may be programmed to have threshold voltage distributions corresponding to the fifth program state PV5. That is, bit lines corresponding to the memory cells to be programmed to the fifth program state PV5 and the memory cells to be programmed to the sixth program state PV6 may be controlled to the program mode (PGM MODE) in which the program permission voltage is applied. Here, bit lines corresponding to the memory cells that have been programmed to the first to fourth program states PV1 to PV4 may be controlled to the program-inhibit mode (INHIBIT MODE) in which the program inhibition voltage is applied.

Here, until the program operation on the memory cells to be programmed to the fifth program state PV5 and memory cells to be programmed to the sixth program state PV6 is terminated, memory cells to be programmed to the remaining program state PV7 to PV7 may be programmed to a pre-program state (pre-state) in which threshold voltage distributions of the memory cells are higher than that in the fifth program state PV5. For example, the program permission voltage may be applied to bit lines of memory cells having threshold voltages lower than that in the sixth program state PV6, among the memory cells to be programmed to the remaining program state PV7, and the program inhibition voltage may be applied to bit lines of memory cells having threshold voltages equal to or higher than that in the sixth program state PV6. That is, among the memory cells to be programmed to the remaining program state PV7, the memory cells having threshold voltages lower than that in the sixth program state PV6 may be controlled to the program mode (PGM MODE).

When the program operation for the fifth program state PV5 is completed, a program operation for the sixth program state PV6 is performed. During the program operation for the sixth program state PV6, memory cells to be programmed to the sixth program state PV6 and memory cells to be programmed to the seventh program state PV7 adjacent to the sixth program state PV6 may be programmed to have threshold voltage distributions corresponding to the sixth program state PV6. That is, bit lines corresponding to memory cells to be programmed to the sixth program state PV6 and memory cells to be programmed to the seventh program state PV7 may be controlled to the program mode (PGM MODE) in which the program permission voltage is applied. Here, bit lines corresponding to the memory cells that have been programmed to the first to fifth program states PV1 to PV5 may be controlled to the program-inhibit mode (INHIBIT MODE) in which the program inhibition voltage is applied.

When the program operation for the sixth program state PV6 is completed, a program operation for the seventh program state PV7 is performed. During the program operation for the seventh program state PV7, the bit lines corresponding to memory cells to be programmed to the seventh program state PV7 may be controlled to the program mode (PGM mode) in which the program permission voltage is applied. Here, bit lines corresponding to the memory cells that have been programmed to the first to sixth program states PV1 to PV6 may be controlled to the program-inhibit mode (INHIBIT MODE) in which the program inhibition voltage is applied.

FIG. 14 is a diagram for describing program modes of memory cells depending on respective program states during a program operation according to an embodiment of the present disclosure.

Referring to FIG. 14, during a program operation for a first program state PV1, memory cells to be programmed to the first program state PV1 and memory cells to be programmed to a second program state PV2 adjacent to the first program state PV1 may be programmed to have a threshold voltage distribution corresponding to the first program state PV1. That is, bit lines corresponding to memory cells to be programmed to the first program state PV1 and memory cells to be programmed to the second program state PV2 may be controlled to a program mode (PGM MODE) in which a program permission voltage is applied.

Here, until a program operation on the memory cells to be programmed to the first program state PV1 and the memory cells to be programmed to the second program state PV2 is terminated, the memory cells to be programmed to the remaining program states PV3 to PV7 may be controlled to the program mode (PGM MODE), and thus the threshold voltage distributions of the memory cells may increase.

When the program operation for the first program state PV1 is completed, a program operation for the second program state PV2 is performed. During the program operation for the second program state PV2, memory cells to be programmed to the second program state PV2 and memory cells to be programmed to the third program state PV3 adjacent to the second program state PV2 may be programmed to have threshold voltage distributions corresponding to the second program state PV2. That is, bit lines corresponding to the memory cells to be programmed to the second program state PV2 and the memory cells to be programmed to the third program state PV3 may be controlled to a program mode (PGM MODE) in which the program permission voltage is applied. Here, the bit lines corresponding to the memory cells that have been programmed to the first program state PV1 may be controlled to a program-inhibit mode (INHIBIT MODE) in which a program inhibition voltage is applied.

Here, until a program operation on the memory cells to be programmed to the second program state PV2 and the memory cells to be programmed to the third program state PV3 is terminated, the memory cells to be programmed to the remaining program states PV4 to PV7 may be controlled to the program mode (PGM MODE), and thus the threshold voltage distributions of the memory cells may increase.

When the program operation for the second program state PV2 is completed, a program operation for the third program state PV3 is performed. During the program operation for the third program state PV3, memory cells to be programmed to the third program state PV3 and memory cells to be programmed to the fourth program state PV4 adjacent to the third program state PV3 may be programmed to have a threshold voltage distribution corresponding to the third program state PV3. That is, bit lines corresponding to memory cells to be programmed to the third program state PV3 and memory cells to be programmed to the fourth program state PV4 may be controlled to the program mode (PGM MODE) in which the program permission voltage is applied. Here, bit lines corresponding to the memory cells that have been programmed to the first program state PV1 and the memory cells that have been programmed to the second program state PV2 may be controlled to the program-inhibit mode (INHIBIT MODE) in which the program inhibition voltage is applied.

Here, until a program operation on the memory cells to be programmed to the third program state PV3 and the memory cells to be programmed to the fourth program state PV4 is terminated, the memory cells to be programmed to the remaining program states PV5 to PV7 may be controlled to the program mode (PGM MODE), and thus the threshold voltage distributions of the memory cells may increase.

When the program operation for the third program state PV3 is completed, a program operation for the fourth program state PV4 is performed. During the program operation for the fourth program state PV4, memory cells to be programmed to the fourth program state PV4 and memory cells to be programmed to the fifth program state PV5 adjacent to the fourth program state PV4 may be programmed to have threshold voltage distributions corresponding to the fourth program state PV4. That is, bit lines corresponding to memory cells to be programmed to the fourth program state PV4 and memory cells to be programmed to the fifth program state PV5 may be controlled to the program mode (PGM MODE) in which the program permission voltage is applied. Here, bit lines corresponding to the memory cells that have been programmed to the first to third program states PV1 to PV3 may be controlled to the program-inhibit mode (INHIBIT MODE) in which the program inhibition voltage is applied.

Here, until a program operation on the memory cells to be programmed to the fourth program state PV4 and the memory cells to be programmed to the fifth program state PV5 is terminated, the memory cells to be programmed to the remaining program states PV6 and PV7 may be controlled to the program mode PGM MODE, and thus the threshold voltage distributions of the memory cells may increase.

When the program operation for the fourth program state PV4 is completed, a program operation for the fifth program state PV5 is performed. During the program operation for the fifth program state PV5, memory cells to be programmed to the fifth program state PV5 and memory cells to be programmed to the sixth program state PV6 adjacent to the fifth program state PV5 may be programmed to have threshold voltage distributions corresponding to the fifth program state PV5. That is, bit lines corresponding to the memory cells to be programmed to the fifth program state PV5 and the memory cells to be programmed to the sixth program state PV6 may be controlled to the program mode (PGM MODE) in which the program permission voltage is applied. Here, bit lines corresponding to the memory cells that have been programmed to the first to fourth program states PV1 to PV4 may be controlled to the program-inhibit mode (INHIBIT MODE) in which the program inhibition voltage is applied.

Here, until a program operation on the memory cells to be programmed to the fifth program state PV5 and the memory cells to be programmed to the sixth program state PV6 is terminated, the memory cells to be programmed to the remaining program state PV7 may be controlled to the program mode (PGM MODE), and thus the threshold voltage distributions of the memory cells may increase.

When the program operation for the fifth program state PV5 is completed, a program operation for the sixth program state PV6 is performed. During the program operation for the sixth program state PV6, memory cells to be programmed to the sixth program state PV6 and memory cells to be programmed to the seventh program state PV7 adjacent to the sixth program state PV6 may be programmed to have threshold voltage distributions corresponding to the sixth program state PV6. That is, bit lines corresponding to memory cells to be programmed to the sixth program state PV6 and memory cells to be programmed to the seventh program state PV7 may be controlled to the program mode (PGM MODE) in which the program permission voltage is applied. Here, bit lines corresponding to the memory cells that have been programmed to the first to fifth program states PV1 to PV5 may be controlled to the program-inhibit mode (INHIBIT MODE) in which the program inhibition voltage is applied.

When the program operation for the sixth program state PV6 is completed, a program operation for the seventh program state PV7 is performed. During the program operation for the seventh program state PV7, the bit lines corresponding to memory cells to be programmed to the seventh program state PV7 may be controlled to the program mode (PGM mode) in which the program permission voltage is applied. Here, bit lines corresponding to the memory cells that have been programmed to the first to sixth program states PV1 to PV6 may be controlled to the program-inhibit mode (INHIBIT MODE) in which the program inhibition voltage is applied.

FIG. 15 is a diagram for describing program modes of memory cells depending on respective program states during a program operation according to an embodiment of the present disclosure.

Referring to FIG. 15, during a program operation for a first program state PV1, memory cells to be programmed to the first program state PV1 may be programmed to have a threshold voltage distribution corresponding to the first program state PV1. That is, bit lines corresponding to the memory cells to be programmed to the first program state PV1 may be controlled to a program mode (PGM MODE) in which a program permission voltage is applied.

Here, until the program operation on the memory cells to be programmed to the first program state PV1 is terminated, memory cells to be programmed to the second program state PV2 adjacent to the first program state PV1 may be programmed to a pre-program state in which the threshold voltage distribution of the memory cells is higher than that in the first program state PV1. For example, the program permission voltage may be applied to bit lines of memory cells having threshold voltages lower than that in the second program state PV2, among the memory cells to be programmed to the second program state PV2, and a program inhibition voltage may be applied to bit lines of memory cells having threshold voltages equal to or higher than that in the second program state PV2. That is, among the memory cells to be programmed to the second program state PV2, the memory cells having threshold voltages lower than that in the second program state PV2 may be controlled to the program mode (PGM MODE).

Also, until a program operation on the memory cells to be programmed to the first program state PV1 is terminated, memory cells to be programmed to the remaining program states PV3 to PV7 may be controlled to the program mode (PGM MODE), and thus the threshold voltage distributions thereof may increase.

When the program operation for the first program state PV1 is completed, a program operation for the second program state PV2 is performed. During the program operation for the second program state PV2, memory cells to be programmed to the second program state PV2 may be programmed to have a threshold voltage distribution corresponding to the second program state PV2. That is, bit lines corresponding to the memory cells to be programmed to the second program state PV2 may be controlled to the program mode (PGM MODE) in which the program permission voltage is applied. Here, the bit lines corresponding to the memory cells that have been programmed to the first program state PV1 may be controlled to a program-inhibit mode (INHIBIT MODE) in which the program inhibition voltage is applied.

Here, until the program operation on the memory cells to be programmed to the second program state PV2 is terminated, memory cells to be programmed to the third program state PV3 adjacent to the second program state PV2 may be programmed to a pre-program state in which threshold voltage distributions of the memory cells are higher than that in the second program state PV2. For example, the program permission voltage may be applied to bit lines of memory cells having threshold voltages lower than that in the third program state PV3, among the memory cells to be programmed to the third program state PV3, and a program inhibition voltage may be applied to bit lines of memory cells having threshold voltages equal to or higher than that in the third program state PV3. That is, among the memory cells to be programmed to the third program state PV3, the memory cells having threshold voltages lower than that in the third program state PV3 may be controlled to the program mode (PGM MODE).

Also, until a program operation on the memory cells to be programmed to the second program state PV2 is terminated, memory cells to be programmed to the remaining program states PV4 to PV7 may be controlled to the program mode (PGM MODE), and thus the threshold voltage distributions thereof may increase.

When the program operation for the second program state PV2 is completed, a program operation for the third program state PV3 is performed. During the program operation for the third program state PV3, memory cells to be programmed to the third program state PV3 may be programmed to have a threshold voltage distribution corresponding to the third program state PV3. That is, bit lines corresponding to the memory cells to be programmed to the third program state PV3 may be controlled to the program mode (PGM MODE) in which a program permission voltage is applied. Here, the bit lines corresponding to the memory cells that have been programmed to the first program state PV1 and the second program state PV2 may be controlled to a program-inhibit mode (INHIBIT MODE) in which the program inhibition voltage is applied.

Until the program operation on the memory cells to be programmed to the third program state PV3 is terminated, memory cells to be programmed to the fourth program state PV4 adjacent to the third program state PV3 may be programmed to a pre-program state in which threshold voltage distributions of the memory cells are higher than that in the third program state PV3. For example, the program permission voltage may be applied to bit lines of memory cells having threshold voltages lower than that in the fourth program state PV4, among the memory cells to be programmed to the fourth program state PV4, and the program inhibition voltage may be applied to bit lines of memory cells having threshold voltages equal to or higher than that in the fourth program state PV4. That is, among the memory cells to be programmed to the fourth program state PV4, the memory cells having threshold voltages lower than that in the fourth program state PV4 may be controlled to the program mode (PGM MODE).

Also, until a program operation on the memory cells to be programmed to the third program state PV3 is terminated, memory cells to be programmed to the remaining program states PV5 to PV7 may be controlled to the program mode (PGM MODE), and thus the threshold voltage distributions thereof may increase.

When the program operation for the third program state PV3 is completed, a program operation for the fourth program state PV4 is performed. During the program operation for the fourth program state PV4, memory cells to be programmed to the fourth program state PV4 may be programmed to have a threshold voltage distribution corresponding to the fourth program state PV4. That is, bit lines corresponding to the memory cells to be programmed to the fourth program state PV4 may be controlled to the program mode (PGM MODE) in which the program permission voltage is applied. Here, bit lines corresponding to the memory cells that have been programmed to the first to third program states PV1 to PV3 may be controlled to the program-inhibit mode (INHIBIT MODE) in which the program inhibition voltage is applied.

Here, until the program operation on the memory cells to be programmed to the fourth program state PV4 is terminated, memory cells to be programmed to the fifth program state PV5 adjacent to the fourth program state PV4 may be programmed to a pre-program state in which threshold voltage distributions of the memory cells are higher than that in the fourth program state PV4. For example, the program permission voltage may be applied to bit lines of memory cells having threshold voltages lower than that in the fifth program state PV5, among the memory cells to be programmed to the fifth program state PV5, and the program inhibition voltage may be applied to bit lines of memory cells having threshold voltages equal to or higher than that in the fifth program state PV5. That is, among the memory cells to be programmed to the fifth program state PV5, the memory cells having threshold voltages lower than that in the fifth program state PV5 may be controlled to the program mode (PGM MODE).

Also, until a program operation on the memory cells to be programmed to the fourth program state PV4 is terminated, memory cells to be programmed to the remaining program states PV6 and PV7 may be controlled to the program mode (PGM MODE), and thus the threshold voltage distributions thereof may increase.

When the program operation for the fourth program state PV4 is completed, a program operation for the fifth program state PV5 is performed. During the program operation for the fifth program state PV5, memory cells to be programmed to the fifth program state PV5 may be programmed to have a threshold voltage distribution corresponding to the fifth program state PV5. That is, bit lines corresponding to the memory cells to be programmed to the fifth program state PV5 may be controlled to the program mode (PGM MODE) in which the program permission voltage is applied. Here, bit lines corresponding to the memory cells that have been programmed to the first to fourth program states PV1 to PV4 may be controlled to the program-inhibit mode (INHIBIT MODE) in which the program inhibition voltage is applied.

Until the program operation on the memory cells to be programmed to the fifth program state PV5 is terminated, memory cells to be programmed to the sixth program state PV6 adjacent to the fifth program state PV5 may be programmed to a pre-program state in which threshold voltage distributions of the memory cells are higher than that in the fifth program state PV5. For example, the program permission voltage may be applied to bit lines of memory cells having threshold voltages lower than that in the sixth program state PV6, among the memory cells to be programmed to the sixth program state PV6, and a program inhibition voltage may be applied to bit lines of memory cells having threshold voltages equal to or higher than that in the sixth program state PV6. That is, among the memory cells to be programmed to the sixth program state PV6, the memory cells having threshold voltages lower than that in the sixth program state PV6 may be controlled to the program mode (PGM MODE).

Also, until a program operation on the memory cells to be programmed to the fifth program state PV5 is terminated, memory cells to be programmed to the remaining program state PV7 may be controlled to the program mode (PGM MODE), and thus the threshold voltage distributions thereof may increase.

When the program operation for the fifth program state PV5 is completed, a program operation for the sixth program state PV6 is performed. During the program operation for the sixth program state PV6, memory cells to be programmed to the sixth program state PV6 may be programmed to have a threshold voltage distribution corresponding to the sixth program state PV6. That is, bit lines corresponding to the memory cells to be programmed to the sixth program state PV6 may be controlled to the program mode (PGM MODE) in which the program permission voltage is applied. Here, bit lines corresponding to the memory cells that have been programmed to the first to fifth program states PV1 to PV5 may be controlled to the program-inhibit mode (INHIBIT MODE) in which the program inhibition voltage is applied.

Until the program operation on the memory cells to be programmed to the sixth program state PV6 is terminated, memory cells to be programmed to the seventh program state PV7 adjacent to the sixth program state PV6 may be programmed to a pre-program state in which threshold voltage distributions of the memory cells are higher than that in the sixth program state PV6. For example, the program permission voltage may be applied to bit lines of memory cells having threshold voltages lower than that in the seventh program state PV7, among the memory cells to be programmed to the seventh program state PV7, and the program inhibition voltage may be applied to bit lines of memory cells having threshold voltages equal to or higher than that in the seventh program state PV7. That is, among the memory cells to be programmed to the seventh program state PV7, the memory cells having threshold voltages lower than that in the seventh program state PV7 may be controlled to the program mode (PGM MODE).

When the program operation for the sixth program state PV6 is completed, a program operation for the seventh program state PV7 is performed. During the program operation for the seventh program state PV7, the bit lines corresponding to memory cells to be programmed to the seventh program state PV7 may be controlled to the program mode (PGM mode) in which the program permission voltage is applied. Here, bit lines corresponding to the memory cells that have been programmed to the first to sixth program states PV1 to PV6 may be controlled to the program-inhibit mode (INHIBIT MODE) in which the program inhibition voltage is applied.

Figure 16:
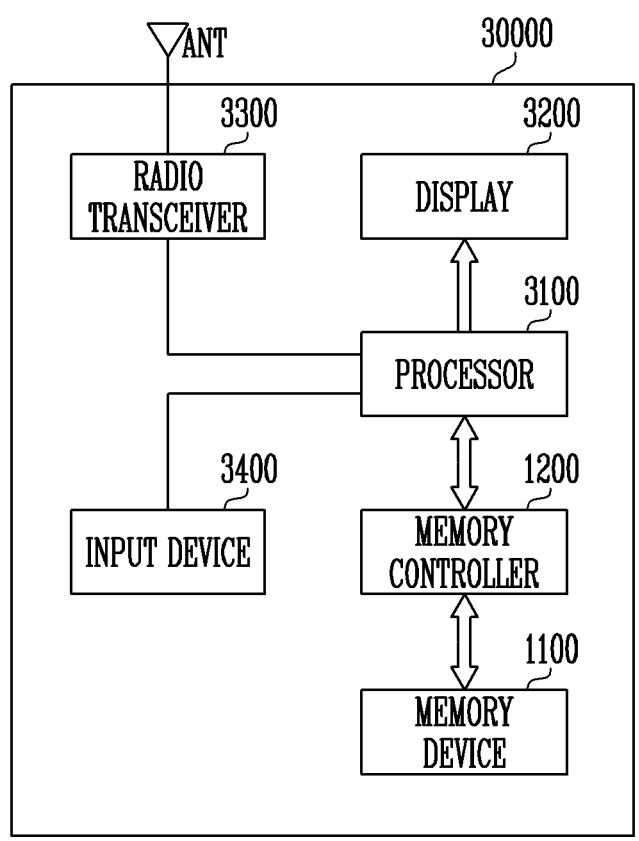
FIG. 16 is a diagram illustrating an embodiment of a memory system.

FIG. 16 is a diagram illustrating an embodiment of a memory system.

Referring to FIG. 16, a memory system 30000 may be implemented as a cellular phone, a smartphone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad, a computer mouse, a keypad or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip provided separately from the processor 3100. Further, the memory controller 1200 may be implemented through the example of the memory controller 1200 illustrated in FIG. 1, and the memory device 1100 may be implemented through the example of the memory device 1100 illustrated in FIG. 2.

Figure 17:
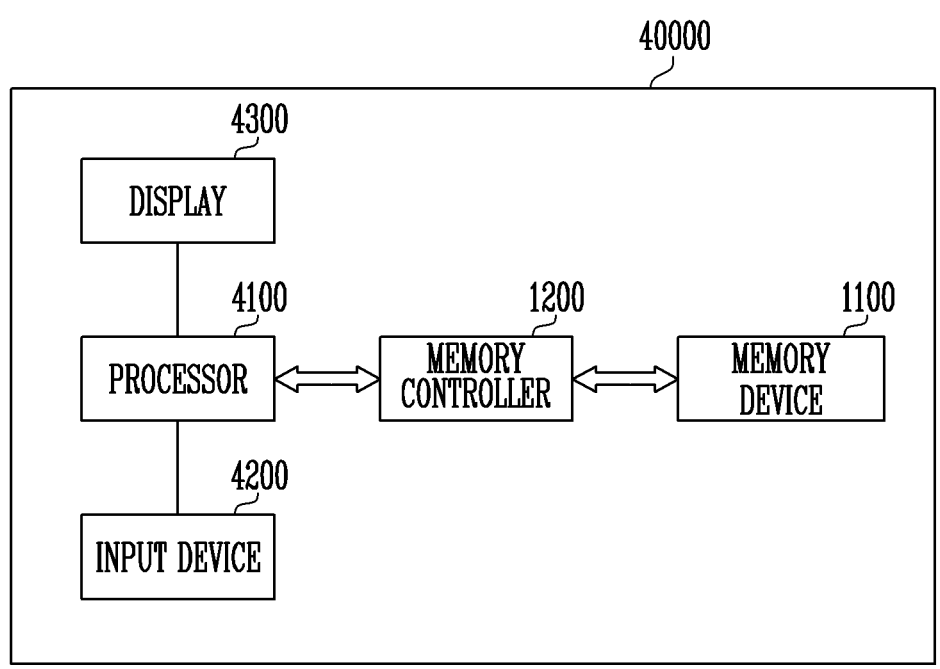
FIG. 17 is a diagram illustrating an embodiment of a memory system.

FIG. 17 is a diagram illustrating an embodiment of a memory system.

Referring to FIG. 17, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device 1100.

A processor 4100 may output data, stored in the memory device 1100, via a display 4300 according to data input through an input device 4200. For example, the input device 4200 may be implemented as a pointing device such as a touch pad, a computer mouse, a keypad or a keyboard.

The processor 4100 may control the overall operation of the memory system 40000, and may control the operation of the memory controller 1200. In an embodiment, the memory controller 1200 capable of controlling the operation of the memory device 1100 may be implemented as a part of the processor 4100 or as a chip provided separately from the processor 4100. Further, the memory controller 1200 may be implemented through the example of the memory controller 1200 illustrated in FIG. 1, and the memory device 1100 may be implemented through the example of the memory device 1100 illustrated in FIG. 2.

Figure 18:
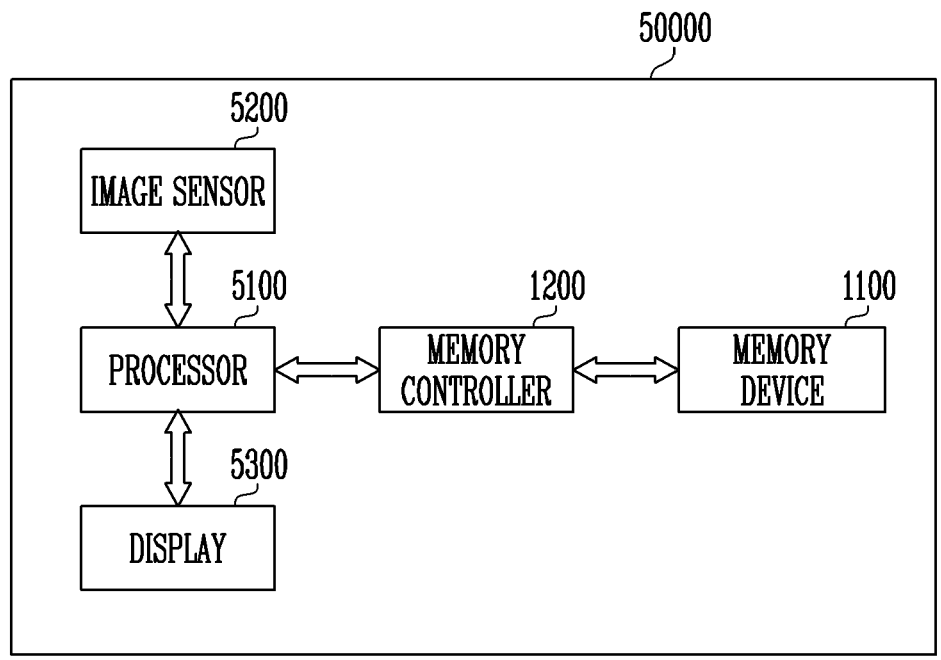
FIG. 18 is a diagram illustrating an embodiment of a memory system.

FIG. 18 is a diagram illustrating an embodiment of a memory system.

Referring to FIG. 18, a memory system 50000 may be implemented as an image processing device, e.g., a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation for the memory device 1100, for example, a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output via a display 5300 or may be stored in the memory device 1100 through the memory controller 1200. Further, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip provided separately from the processor 5100. Further, the memory controller 1200 may be implemented through the example of the memory controller 1200 illustrated in FIG. 1, and the memory device 1100 may be implemented through the example of the memory device 1100 illustrated in FIG. 2.

Figure 19:
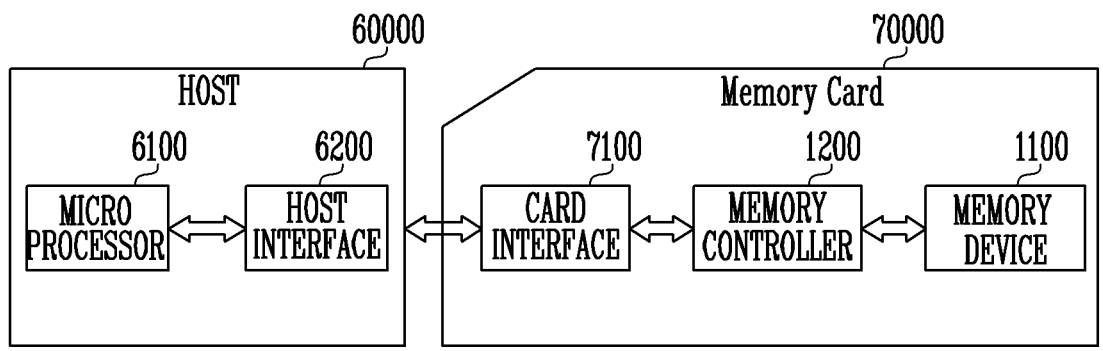
FIG. 19 is a diagram illustrating an embodiment of a memory system.

FIG. 19 is a diagram illustrating an embodiment of a memory system.

Referring to FIG. 19, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface. Further, the memory controller 1200 may be implemented through the example of the memory controller 1200 illustrated in FIG. 1, and the memory device 1100 may be implemented through the example of the memory device 1100 illustrated in FIG. 2.

Further, the card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

The present disclosure may improve the range of threshold voltage distributions of memory cells during a program operation of the memory device, and may also improve the speed of the program operation of the memory device.

In the above-discussed embodiments, all operations may be selectively performed or skipped. In addition, the operations in each embodiment may not always be sequentially performed, and may be randomly performed. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

What is claimed is:

1. A memory device, comprising:
 a memory cell array including a plurality of memory cells;
 a peripheral circuit configured to perform a plurality of program operations to program the plurality of memory cells to a plurality of program states; and
 a control logic configured to, during a program operation of the plurality of program operations for a selected program state among the plurality of program states, control the peripheral circuit to:

program, to the selected program state, first memory cells that target the selected program state among the plurality of memory cells, using a first verify voltage corresponding to the selected program state, program, to the selected program state, second memory cells that target a first program state immediately higher than the selected program state among the plurality of memory cells, using the first verify voltage, and program, to a pre-program state corresponding to the first program state, third memory cells that target each of second program states higher than the first program state among the plurality of memory cells, using a second verify voltage corresponding to the first program state.

2. The memory device according to claim 1, wherein the pre-program state is a program state adjacent to the selected program state.

3. The memory device according to claim 1, wherein the peripheral circuit sequentially performs a verify operation for the selected program state by applying the first verify voltage to the second memory cells and a verify operation for the pre-program state by applying the second verify voltage to the third memory cells, during the program operation.

4. The memory device according to claim 1, wherein the peripheral circuit sequentially performs the plurality of program operations corresponding to the plurality of program states in a sequence from a program operation corresponding to a program state in which a threshold voltage distribution is low.

5. A memory device, comprising:
a memory cell array including a plurality of memory cells;
a peripheral circuit configured to perform a plurality of program operations to program the plurality of memory cells to a plurality of program states; and
a control logic configured to, during a program operation of the plurality of program operations for a first program state among the plurality of program states, control the peripheral circuit to:
program, to the first program state, first memory cells that target the first program state among the plurality of memory cells, using a first verify voltage corresponding to the first program state, and
program, to a pre-program state higher than the first program state, second memory cells that target each of second program states higher than the first program state among the plurality of memory cells, using a second verify voltage corresponding to a second program state that is immediately higher than the first program state among the second program states,
wherein the peripheral circuit sequentially performs the plurality of program operations corresponding to the plurality of program states, in a sequence from a program operation corresponding to a program state in which a threshold voltage is low.

6. The memory device according to claim 5, wherein the pre-program state is a program state adjacent to the first program state.

7. The memory device according to claim 5, wherein the peripheral circuit sequentially performs a verify operation for the first program state by applying the first verify voltage to the first memory cells and a verify operation for the pre-program state by applying the second verify voltage to the second memory cells, during the program operation.

8. A method of operating a memory device, comprising:
programming first memory cells that target a first program state among a plurality of memory cells, using a first verify voltage corresponding to the first program state;
programming second memory cells that target a second program state immediately higher than the first program state among the plurality of memory cells, using the first verify voltage; and
programming third memory cells that target each of third program states higher than the second program state among the plurality of memory cells, using a second verify voltage corresponding to the second program state.

9. The method according to claim 8, wherein a first program verify operation by applying the first verify voltage to the first memory cells and the second memory cells, and a second program verify operation by applying the second verify voltage to the third memory cells are sequentially performed.

10. The method according to claim 8, wherein the first memory cells and the second memory cells are programmed together to the first program state.

* * * * *